(12) United States Patent
So et al.

(10) Patent No.: US 10,991,915 B2
(45) Date of Patent: Apr. 27, 2021

(54) ORGANIC LIGHT-EMITTING DIODES COMPRISING GRATING STRUCTURES AND LIGHT EXTRACTION LAYERS

(71) Applicant: University of Florida Research Foundation, Incorporated, Gainesville, FL (US)

(72) Inventors: Franky Fat Kei So, Cary, NC (US); Kirk S. Schanze, Helotes, TX (US); Xiangyu Fu, Raleigh, NC (US); Wooram Youn, Gainesville, FL (US)

(73) Assignee: UNIVERSITY OF FLORIDA RESEARCH FOUNDATION, INCORPORATED, Gainesville, FL (US)

( * ) Notice: Subject to any disclaimer, the term of this patent is extended or adjusted under 35 U.S.C. 154(b) by 0 days.

(21) Appl. No.: 16/067,073

(22) PCT Filed: Jan. 27, 2017

(86) PCT No.: PCT/US2017/015438
§ 371 (c)(1),
(2) Date: Jun. 28, 2018

(87) PCT Pub. No.: WO2017/132568
PCT Pub. Date: Aug. 3, 2017

(65) Prior Publication Data
US 2019/0013497 A1   Jan. 10, 2019

Related U.S. Application Data

(60) Provisional application No. 62/289,052, filed on Jan. 29, 2016.

(51) Int. Cl.
*H01L 51/52* (2006.01)
*G02B 27/42* (2006.01)
(Continued)

(52) U.S. Cl.
CPC ........ *H01L 51/5275* (2013.01); *G02B 27/425* (2013.01); *H01L 51/5056* (2013.01);
(Continued)

(58) Field of Classification Search
None
See application file for complete search history.

(56) References Cited

U.S. PATENT DOCUMENTS 9,130,195 B2    9/2015  Ma et al.
2005/0146268 A1*  7/2005  Seo .......................... C09K 11/06
                                              313/506
(Continued)

FOREIGN PATENT DOCUMENTS

WO    WO 2015/070217 A1    5/2015
WO    WO 2017/132568 A1    8/2017

OTHER PUBLICATIONS

Refractiveindex.info https://refractiveindex.info/?shelf=3d&book=metals&page=gold, Jul. 19, 2019. (Year: 2019).*

(Continued)

*Primary Examiner* — Jay C Chang
(74) *Attorney, Agent, or Firm* — Alston & Bird LLP

(57) ABSTRACT

Embodiments described herein generally relate to organic light-emitting diodes (OLEDs) comprising a substrate, a light extraction layer, a first electrode, one or more organic layers, and a second electrode. In some embodiments, the light extraction layer is positioned between the substrate and the first electrode. According to some embodiments, an interface between the light extraction layer and the first electrode comprises a grating structure. The grating structure may, in certain cases, promote outcoupling of light generated within the OLED (e.g., through diffraction).

78 Claims, 10 Drawing Sheets

(51) Int. Cl.
H05B 33/22 (2006.01)
H01L 51/50 (2006.01)
(52) U.S. Cl.
CPC ...... H01L 51/5072 (2013.01); H01L 51/5092 (2013.01); H01L 51/5203 (2013.01); H05B 33/22 (2013.01)

(56) References Cited

U.S. PATENT DOCUMENTS

| | | | |
|---|---|---|---|
| 2007/0007538 A1* | 1/2007 | Ono | H01L 51/5012 257/79 |
| 2007/0291359 A1* | 12/2007 | Ushigome | G02B 5/04 359/485.02 |
| 2009/0004507 A1* | 1/2009 | Suzuki | C09K 11/06 428/704 |
| 2014/0008628 A1* | 1/2014 | Yamana | H01L 51/0096 257/40 |
| 2014/0203271 A1* | 7/2014 | Yoneda | H01L 51/5265 257/40 |
| 2014/0217365 A1 | 8/2014 | So et al. | |
| 2015/0060840 A1* | 3/2015 | Nishimura | H01L 51/5275 257/40 |
| 2015/0179982 A1* | 6/2015 | Yon Ehara | H01L 51/5271 257/40 |
| 2015/0236300 A1* | 8/2015 | Naraoka | H01L 51/5262 257/40 |
| 2015/0311474 A1* | 10/2015 | Basil | H01L 51/5012 257/40 |
| 2015/0333107 A1* | 11/2015 | Gee | H01L 27/322 257/40 |
| 2016/0254492 A1* | 9/2016 | Wu | H01L 51/56 257/40 |

OTHER PUBLICATIONS

Refractiveindex.info https://refractiveindex.info/?shelf=main&book=ZrO2&page=Wood, Jul. 19, 2019. (Year: 2019).*
Refractiveindex.info https://refractiveindex.info/?shelf=main&book=Al&page=Rakic, Jan. 15, 2020. (Year: 2020).*
Refractiveindex.info https://refractiveindex.info/?shelf=glass&book=soda-lime&page=Rubin-clear Jan. 2020. (Year: 2020).*
Refractiveindex.info https://refractiveindex.info/?shelf=organic&book=poly%28methyl_methacrylate%29&page=Sultanova Jan. 2020. (Year: 2020).*
Refractiveindex.info https://refractiveindex.info/?shelf=main&book=NaF&page=Li Jan. 2020. (Year: 2020).*
Refractiveindex.info https://refractiveindex.info/?shelf=other&book=In2O3-SnO2&page=Moerland, Jun. 2020. (Year: 2020).*
Refractiveindex.info https://refractiveindex.info/?shelf=main&book=LiF&page=Li, Jun. 2020. (Year: 2020).*
Refractiveindex.info https://refractiveindex.info/?shelf=glass&book=soda-lime&page=Rubin-clear Jun. 2020. (Year: 2020).*
Refractiveindex.info https://refractiveindex.info/?shelf=organic&book=poly%28methyl_methacrylate%29&page=Sultanova Jun. 2020. (Year: 2020).*
WIPO Application No. PCT/US2017/015438, PCT International Preliminary Report on Patentability dated Jul. 31, 2018.
WIPO Application No. PCT/US2017/015438, PCT International Search Report dated Apr. 10, 2017.
WIPO Application No. PCT/US2017/015438, PCT Written Opinion of the International Searching Authority dated Apr. 10, 2017.

* cited by examiner

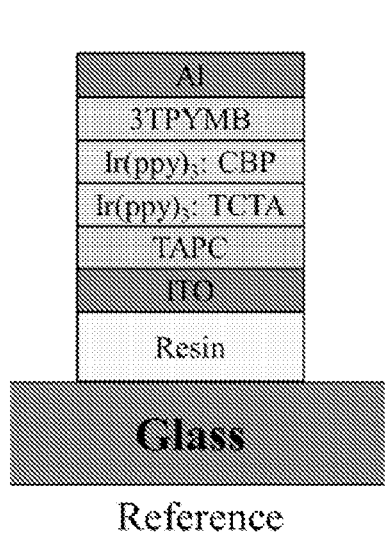
FIG. 5A Reference
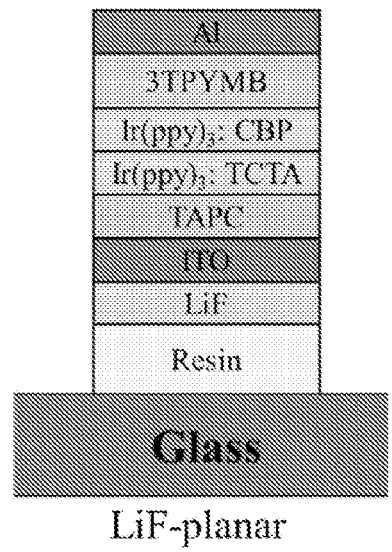
FIG. 5B LiF-planar
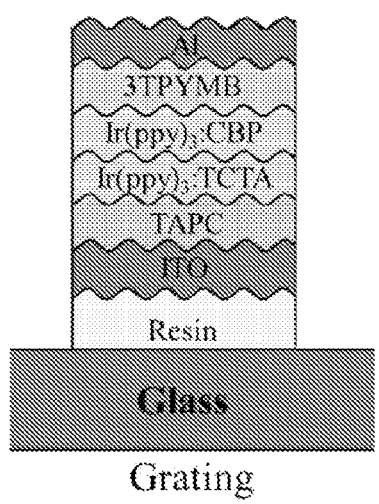
FIG. 5C Grating
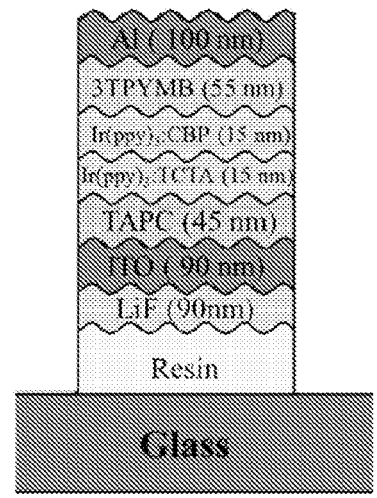
FIG. 5D LiF-grating

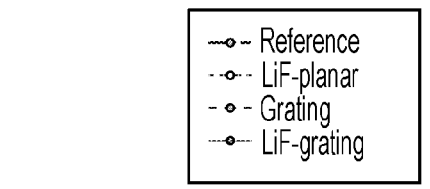
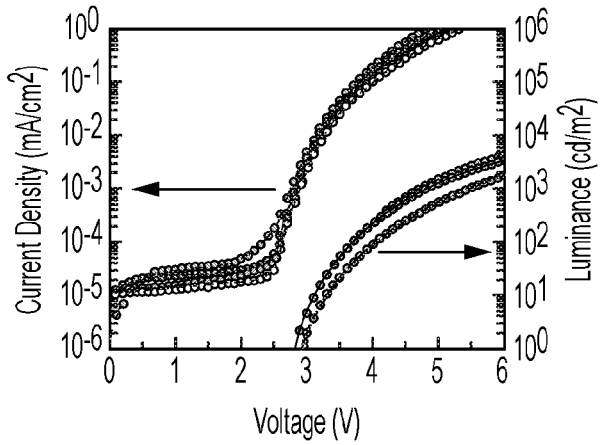
FIG. 6A
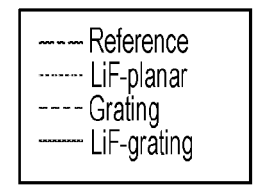
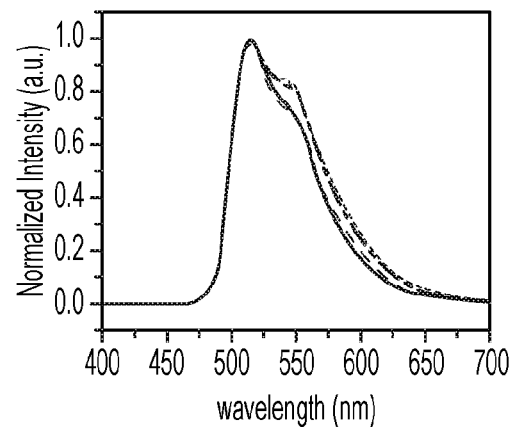
FIG. 6B
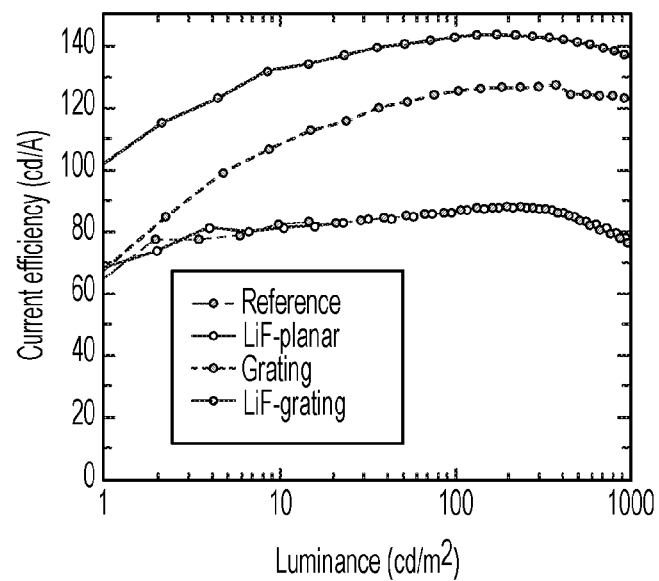
FIG. 6C

Reference

LiF-planar

Grating

LiF-grating

ORGANIC LIGHT-EMITTING DIODES COMPRISING GRATING STRUCTURES AND LIGHT EXTRACTION LAYERS

CROSS REFERENCE TO RELATED APPLICATIONS

This application is a 371 National Stage Application of PCT/US2017/015438, filed Jan. 27, 2017, which claims the benefit under 35 § U.S.C 119(e) of U.S. Provisional Patent Application No. 62/289,052, filed Jan. 29, 2016, the contents of all of which are incorporated herein by reference in their entirety.

GOVERNMENT FUNDING

This invention was made with government support under Contract No. DE-FG02-07ER46464 awarded by the Department of Energy. The government has certain rights in the invention.

FIELD

Embodiments described herein generally relate to organic light-emitting diodes (OLEDs).

BACKGROUND

Organic light-emitting diodes (OLEDs) have been the focus of research over the past 30 years. Due to their fast response, flexibility, and low-cost processing, OLEDs have been recognized as promising candidates for next-generation light sources and displays. Although intensive research has resulted in OLEDs with 100% internal quantum efficiency, low outcoupling efficiency remains a significant challenge.

FIG. 1 is a schematic illustration of a conventional bottom-emitting OLED 100 comprising a transparent substrate 110, a first electrode 120, one or more organic layers 130, and a second electrode 140. As shown in FIG. 1, each layer of conventional OLED 100 is substantially planar. In operation, a relatively small percentage of light generated within one or more organic layers 130 may be emitted (i.e., outcoupled) from OLED 100 through substrate 110. For example, a relatively large percentage of generated light may be lost to substrate mode, waveguided mode, and/or surface plasmon (SP) mode. In conventional OLEDs, such as the one shown in FIG. 1, typically only 20-30% of generated light is outcoupled.

SUMMARY

Compositions and methods related to OLEDs are disclosed. The subject matter of the present invention involves, in some cases, interrelated products, alternative solutions to a particular problem, and/or a plurality of different uses of one or more systems and/or articles.

Certain embodiments are directed to an organic light-emitting diode (OLED). In some embodiments, the OLED comprises a substrate. In some embodiments, the OLED comprises a first electrode. In some embodiments, the OLED comprises a second electrode. In some embodiments, the OLED comprises one or more organic layers positioned between the first electrode and the second electrode. In certain embodiments, the one or more organic layers comprise a light-emitting layer. In some embodiments, the OLED comprises a light extraction layer positioned between the substrate and the first electrode. In certain embodiments, a difference between a refractive index of the light extraction layer and a refractive index of the first electrode has a magnitude of at least 0.20. In certain embodiments, a first interface between the light extraction layer and the first electrode comprises a first grating structure.

Certain embodiments are directed to a method of fabricating an OLED. In some embodiments, the method comprises providing a substrate. In certain embodiments, a first surface of the substrate comprises a grating structure. In some embodiments, the method comprises depositing a light extraction layer on the first surface of the substrate. In some embodiments, the method comprises depositing a first electrode on the light extraction layer. In some embodiments, the method comprises depositing one or more organic layers on the first electrode. In certain embodiments, the one or more organic layers comprise a light-emitting layer. In some embodiments, the method comprises depositing a second electrode on the one or more organic layers. In certain embodiments, a difference between a refractive index of the light extraction layer and a refractive index of the first electrode has a magnitude of at least 0.20.

It should be appreciated that the foregoing concepts, and additional concepts discussed below, may be arranged in any suitable combination, as the present disclosure is not limited in this respect. Further, other advantages and novel features of the present invention will become apparent from the following detailed description of various non-limiting embodiments of the invention when considered in conjunction with the accompanying figures. In cases where the present specification and a document incorporated by reference include conflicting and/or inconsistent disclosure, the present specification shall control. If two or more documents incorporated by reference include conflicting and/or inconsistent disclosure with respect to each other, then the document having the later effective date shall control.

BRIEF DESCRIPTION OF THE DRAWINGS

Non-limiting embodiments of the present invention will be described by way of example with reference to the accompanying figures, which are schematic and are not intended to be drawn to scale. In the figures, each identical or nearly identical component illustrated is typically represented by a single numeral. For purposes of clarity, not every component is labeled in every figure, nor is every component of each embodiment of the invention shown where illustration is not necessary to allow those of ordinary skill in the art to understand the invention. In the figures:

FIG. 5A shows a schematic illustration of a planar OLED that does not comprise an LiF layer ("reference OLED"), according to some embodiments;

FIG. 5B shows a schematic illustration of a planar OLED comprising an LiF layer ("LiF-planar OLED"), according to some embodiments;

FIG. 5C shows a schematic illustration of a grating OLED that does not comprise an LiF layer ("grating OLED"), according to some embodiments;

FIG. 5D shows a schematic illustration of a grating OLED comprising an LiF layer ("LiF-grating OLED"), according to some embodiments;

FIG. 6A shows, according to some embodiments, a plot of current density (mA/cm$^2$) and luminance (cd/m$^2$) as a function of voltage (V) for the reference OLED, LiF-planar OLED, grating OLED, and LiF-grating OLED illustrated in FIGS. 5A-D;

FIG. 6B shows, according to some embodiments, a plot of normalized intensity (a.u.) as a function of wavelength (nm) for the reference OLED, LiF-planar OLED, grating OLED, and LiF-grating OLED illustrated in FIGS. 5A-D;

FIG. 6C shows, according to some embodiments, a plot of current efficiency (cd/A) as a function of luminance (cd/m$^2$) for the reference OLED, LiF-planar OLED, grating OLED, and LiF-grating OLED illustrated in FIGS. 5A-D;

DETAILED DESCRIPTION

Figure 1:
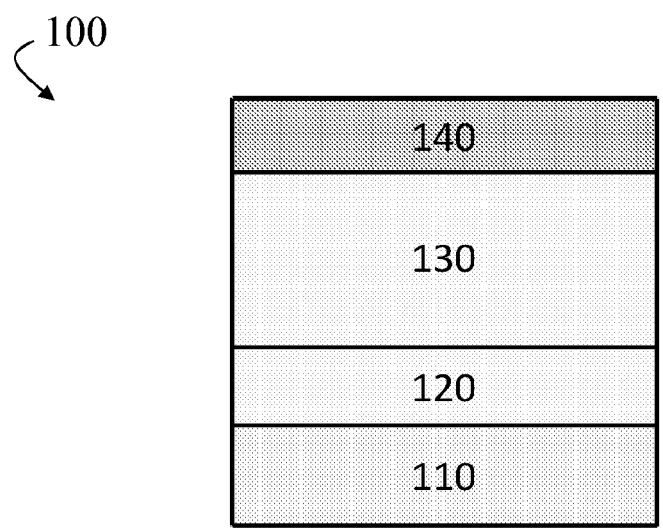
FIG. 1 is an exemplary schematic illustration of a conventional bottom-emitting OLED comprising a substrate, a first electrode, one or more organic layers, and a second electrode, wherein each layer of the OLED is substantially planar.

Embodiments described herein generally relate to organic light-emitting diodes (OLEDs) comprising a substrate, a light extraction layer, a first electrode, one or more organic layers, and a second electrode. In some embodiments, the light extraction layer is positioned between the substrate and the first electrode. According to some embodiments, an interface between the light extraction layer and the first electrode comprises a grating structure. The grating structure may, in certain cases, promote outcoupling of light generated within the OLED (e.g., through diffraction).

Conventional OLEDs (e.g., substantially planar OLEDs comprising a substrate, a first electrode, one or more organic layers, and a second electrode) generally have low outcoupling efficiency, with a relatively small percentage of light generated within the OLED being emitted externally. In some cases, for example, a relatively large percentage of light generated within the OLED is lost to the substrate mode, waveguided mode, and/or surface plasmon (SP) mode. In certain cases, generated light may become trapped in substrate mode due to internal reflection at an external surface of the substrate, which may be caused by a refractive index mismatch between the substrate and the external environment (e.g., air). In certain cases, generated light may become trapped in waveguided mode due to internal reflection at an interface between the substrate and the first electrode, which may be caused by a refractive index mismatch between the substrate and the first electrode. In certain cases, generated light may become trapped in SP mode due to generated photons exciting SP waves that propagate along an interface between the one or more organic layers and the second electrode (e.g., a metal electrode).

In some cases, an interface between the substrate and the first electrode comprises a grating structure to promote extraction of a waveguided mode (e.g., through diffraction). However, the ability of the grating structure to extract the waveguided mode may be limited by a relatively small difference between the refractive index of the first electrode and the refractive index of the substrate. It has been recognized within the context of this invention that an OLED comprising a light extraction layer positioned between the substrate and the first electrode, where a difference between the refractive index of the light extraction layer and the refractive index of the first electrode has a magnitude of at least about 0.20, and where an interface between the light extraction layer and the first electrode comprises a grating structure, may exhibit enhanced outcoupling efficiency. Without wishing to be bound by a particular theory, the presence of the light extraction layer may promote the efficiency of the grating structure in extracting the waveguided mode by increasing the refractive index difference between the layers on opposing sides of the grating structure. In some cases, the grating structure may extract at least a portion of generated light trapped in the waveguided mode and surface plasmon mode into a substrate mode, which may be outcoupled to an external mode as described in further detail below.

Figure 2:
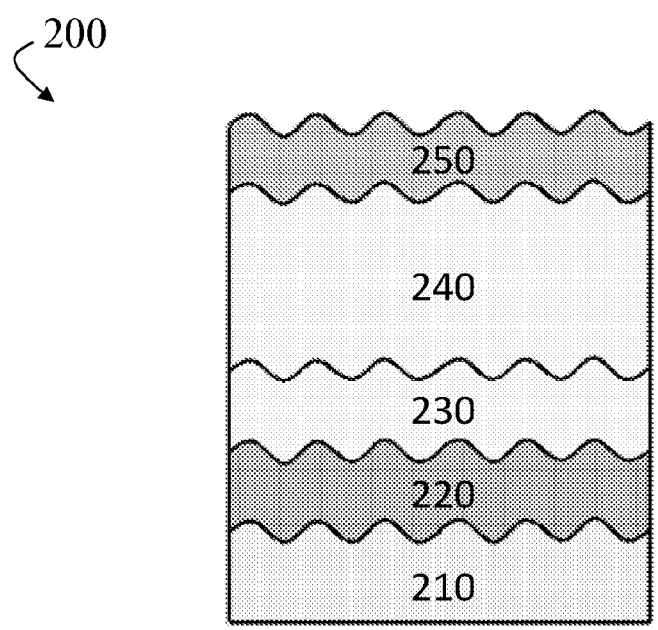
FIG. 2 is, according to some embodiments, an exemplary schematic illustration of an OLED comprising a substrate, a light extraction layer, a first electrode, one or more organic layers, and a second electrode.

FIG. 2 shows an exemplary schematic illustration of an OLED comprising a light extraction layer, according to some embodiments. In FIG. 2, OLED 200 is a multi-layered structure comprising substrate 210, light extraction layer 220, first electrode 230, one or more organic layers 240, and second electrode 250. As shown in FIG. 2, light extraction layer 220 may be positioned adjacent substrate 110, and first electrode 230 may be positioned adjacent light extraction layer 220. One or more organic layers 240 may be positioned adjacent first electrode 230. In some embodiments, one or more organic layers 240 may comprise a light-emitting layer. Second electrode 250 may be positioned adjacent one or more organic layers 240. As used herein, when a layer is referred to as being "on," "on top of," or "adjacent" another layer, it can be directly on, on top of, or adjacent the layer, or an intervening layer may also be present. A layer that is "directly on," "directly adjacent," "in contact with," or "in direct physical contact with" another layer means that no intervening layer is present. Likewise, a layer that is positioned "between" two layers may be directly between the two layers such that no intervening layer is present, or an intervening layer may be present.

In OLED 200, as illustrated in FIG. 2, light extraction layer 220 is positioned directly adjacent substrate 110, first electrode 230 is positioned directly adjacent light extraction layer 220, one or more organic layers 240 are positioned directly adjacent first electrode 230, and second electrode 250 is positioned directly adjacent one or more organic layers 240. However, in some embodiments, one or more intervening layers may be present between any two layers in OLED 200.

As shown in FIG. 2, an interface between light extraction layer 220 and first electrode 230 may comprise a grating structure. In addition, an interface between substrate 210 and light extraction layer 220, an interface between first electrode 230 and one or more organic layers 240, an interface between one or more organic layers 240 and second electrode 250, and an external surface of second electrode 250 may comprise a grating structure. While FIG. 2 shows five surfaces within the OLED that comprise a grating structure, each surface independently may or may not comprise a grating structure.

In operation, a voltage may be applied between first electrode 230 and second electrode 250. In certain cases, under the applied voltage, holes may be injected into one or more organic layers 240 (e.g., from first electrode 230), and electrons may be injected into one or more organic layers 240 (e.g., from second electrode 250). In some embodiments, the injected holes and electrons may combine in a light-emitting layer of one or more organic layers 240 to form an exciton, and decay of the exciton may result in generation of light (e.g., visible light). In some embodiments, at least a portion of the generated light may be outcoupled and may exit OLED 200 through substrate 210. In some embodiments, at least a portion of the generated light may be trapped in substrate mode, waveguided mode, and/or SP mode. In some cases, the presence of one or more grating structures between substrate 210 and first electrode 230 may promote extraction of the waveguided mode into the substrate mode and/or the external mode (e.g., the air mode). In certain embodiments, the presence of light extraction layer 220 between substrate 210 and first electrode 230 may further promote extraction of the waveguided mode.

According to some embodiments, the OLED comprises a substrate. Examples of suitable materials for the substrate include, but are not limited to, glass, sapphire, plastic, and quartz.

In some embodiments, the substrate is at least partially transparent to a peak wavelength of light generated by a light-emitting layer of the OLED. As used herein, the peak wavelength refers to the wavelength of greatest intensity of the generated light. In certain embodiments, the substrate (i.e., the substrate itself, irrespective of any transmission, absorption, and/or reflection that may occur at any interface or in any other layer of the OLED) transmits at least about 70%, at least about 75%, at least about 80%, at least about 85%, at least about 90%, a least about 95%, at least about 99%, or about 100% of a peak wavelength of light generated by the light-emitting layer of the OLED. In some embodiments, the substrate transmits between about 70% and about 100%, between about 75% and about 100%, between about 80% and about 100%, between about 85% and about 100%, between about 90% and about 100%, or between about 95% and about 100% of a peak wavelength of light generated by the light-emitting layer of the OLED. In some embodiments, the substrate is at least partially transparent to a peak wavelength between about 380 nm and about 450 nm, between about 380 nm and about 495 nm, between about 380 nm and about 570 nm, between about 380 nm and about 590 nm, between about 380 nm and about 620 nm, between about 380 nm and about 700 nm, between about 380 nm and about 750 nm, between about 400 nm and about 450 nm, between about 400 nm and about 495 nm, between about 400 nm and about 570 nm, between about 400 nm and about 590 nm, between about 400 nm and about 620 nm, between about 400 nm and about 700 nm, between about 400 nm and about 750 nm, between about 450 nm and about 495 nm, between about 450 nm and about 570 nm, between about 450 nm and about 590 nm, between about 450 nm and about 620 nm, between about 450 nm and about 700 nm, between about 450 nm and about 750 nm, between about 495 nm and about 570 nm, between about 495 nm and about 590 nm, between about 495 nm and about 620 nm, between about 495 nm and about 700 nm, between about 495 nm and about 750 nm, between about 570 nm and about 590 nm, between about 570 nm and about 620 nm, between about 570 nm and about 700 nm, between about 570 nm and about 750 nm, between about 590 nm and about 620 nm, between about 590 nm and about 700 nm, between about 590 nm and about 750 nm, between about 620 nm and about 700 nm, between about 620 nm and about 750 nm, or between about 700 nm and about 750 nm. In some embodiments, the substrate is at least partially transparent to at least a portion of the visible spectrum (e.g., about 400 nm to about 700 nm).

In certain embodiments, the substrate has a refractive index of at least about 1.40, at least about 1.45, at least about 1.50, at least about 1.55, at least about 1.60, at least about 1.65, at least about 1.70, at least about 1.75, or at least about 1.80. In some embodiments, the substrate has a refractive index of about 1.80 or less, about 1.75 or less, about 1.70 or less, about 1.65 or less, about 1.60 or less, about 1.55 or less, about 1.50 or less, about 1.45 or less, or about 1.40 or less. The substrate may, in some embodiments, have a refractive index between about 1.40 and about 1.50, between about 1.40 and about 1.60, between about 1.40 and about 1.70, between about 1.40 and about 1.80, between about 1.45 and about 1.50, between about 1.45 and about 1.55, between about 1.45 and about 1.60, between about 1.45 and about 1.65, between about 1.45 and about 1.70, between about 1.45 and about 1.75, between about 1.45 and about 1.80, between about 1.50 and about 1.55, between about 1.50 and about 1.60, between about 1.50 and about 1.65, between about 1.50 and about 1.70, between about 1.50 and about 1.75, between about 1.50 and about 1.80, between about 1.55 and about 1.60, between about 1.55 and about 1.65, between about 1.55 and about 1.70, between about 1.55 and about 1.75, between about 1.55 and about 1.80, between about 1.60 and about 1.65, between about 1.60 and about 1.70, between about 1.60 and about 1.75, between about 1.60 and about 1.80, between about 1.65 and about 1.70, between about 1.65 and about 1.75, between about 1.65 and about 1.80, between about 1.70 and about 1.75. between about 1.70 and about 1.80, or between about 1.75 and about 1.80. As used herein, the refractive index of a layer (e.g., a substrate) of an OLED refers to the refractive index of the layer at a peak wavelength of light generated by a light-emitting layer of the OLED. The refractive index of the substrate may be measured according to any method known in the art. For example, the refractive index may be measured using an ellipsometer.

In some embodiments, an external surface of the substrate (i.e., an interface between the substrate and the external environment) and/or an interface between the substrate and the light extraction layer comprise a grating structure. A grating structure generally refers to a structure comprising a plurality of protrusions. The protrusions of the grating structure may have any suitable shape. In some embodiments, for example, at least some protrusions of the grating structure have a substantially rectangular, substantially triangular, substantially semicircular, or substantially curved (e.g., substantially Gaussian or substantially sinusoidal) cross section. In some embodiments, the protrusions of the grating structure define successive alternating peaks and valleys. The grating structure may, according to some embodiments, have a substantially periodic or quasi-periodic structure. For example, the protrusions of the grating structure may be spaced such that a peak-to-peak distance between successive protrusions is substantially similar. In some embodiments, the grating structure may be formed from a layer on either side of the grating structure (e.g., the substrate, the light extraction layer). In certain embodiments, for example, at least a portion of the substrate and/or light extraction layer may be etched and/or molded to produce the grating structure. In certain other embodiments, the grating structure may be formed of a material that is separate from the materials of the layers on either side of the grating structure. For example, in some embodiments, protrusions may be formed of a separate material and printed, adhered, or otherwise attached to a layer of the OLED (e.g., the substrate, the light extraction layer). It should be noted that in some embodiments, an external surface of the substrate and/or an interface between the substrate and the light extraction layer do not comprise a grating structure.

In some embodiments, a grating structure of the external surface of the substrate and/or the interface between the substrate and the light extraction layer has an average periodicity. As used herein, the "periodicity" of a grating structure of a surface or interface refers to a spatial distance, within a plane parallel to the surface or interface, between a peak and an adjacent peak, or a valley and an adjacent valley. The average periodicity of a grating structure of a surface or interface generally refers to the number average of the spatial distances between adjacent peaks or adjacent valleys of the grating structure. In some cases, the grating structure of the external surface of the substrate and/or the interface between the substrate and the light extraction layer has an average periodicity of at least about 200 nm, at least about 300 nm, at least about 400 nm, at least about 500 nm, at least about 1000 nm, at least about 1500 nm, or at least about 2000 nm. In some embodiments, the grating structure of the external surface of the substrate and/or the interface between the substrate and the light extraction layer has an average periodicity of about 2000 nm or less, about 1500 nm or less, about 1000 nm or less, about 500 nm or less, about 400 nm or less, about 300 nm or less, or about 200 nm or less. In certain embodiments, the grating structure of the external surface of the substrate and/or the interface between the substrate and the light extraction layer has an average periodicity between about 200 nm and about 500 nm, between about 200 nm and about 1000 nm, between about 200 nm and about 1500 nm, between about 200 nm and about 2000 nm, between about 300 nm and about 500 nm, between about 300 nm and about 1000 nm, between about 300 nm and about 1500 nm, between about 300 nm and about 2000 nm, between about 400 nm and about 1000 nm, between about 400 nm and about 1500 nm, between about 400 nm and about 2000 nm, between about 500 nm and about 1000 nm, between about 500 nm and about 1500 nm, between about 500 nm and about 2000 nm, between about 1000 nm and about 1500 nm, between about 1000 nm and about 2000 nm, or between about 1500 nm and about 2000 nm. The periodicity of a grating structure may be measured according to any method known in the art. For example, periodicity may be measured using atomic force microscopy (AFM) and/or scanning electron microscopy (SEM).

In some embodiments, a grating structure of the external surface of the substrate and/or the interface between the substrate and the light extraction layer has an average amplitude. As used herein, the "amplitude" of a grating structure of a surface or interface refers to a spatial distance, within a plane orthogonal to the surface or interface, between a peak and an adjacent valley (e.g., peak-to-valley distance). The average amplitude of a grating structure of a surface or interface generally refers to the number average of the amplitudes of the grating structure. In some embodiments, the grating structure of the external surface of the substrate and/or the interface between the substrate and the light extraction layer has an average amplitude of at least about 30 nm, at least about 50 nm, at least about 70 nm, at least about 90 nm, at least about 100 nm, at least about 130 nm, or at least about 150 nm. In some embodiments, the grating structure of the external surface of the substrate and/or the interface between the substrate and the light extraction layer has an average amplitude of about 150 nm or less, about 130 nm or less, about 100 nm or less, about 90 nm or less, about 70 nm or less, about 50 nm or less, or about 30 nm or less. In certain embodiments, the grating structure of the external surface of the substrate and/or the interface between the substrate and the light extraction layer has an average amplitude between about 30 nm and about 50 nm, between about 30 nm and about 100 nm, between about 30 nm and about 150 nm, between about 50 nm and about 100 nm, between about 50 nm and about 150 nm, or between about 100 nm and about 150 nm. The amplitude of a grating structure may be measured according to any method known in the art. For example, amplitude may be measured using atomic force microscopy (AFM) and/or scanning electron microscopy (SEM).

In some embodiments, the grating structure of the external surface of the substrate covers a significant portion of the external surface. For example, in some embodiments, the grating structure of the external surface of the substrate covers at least about 50%, at least about 60%, at least about 70%, at least about 80%, at least about 90%, at least about 95%, at least about 99%, or about 100% of the area of the external surface of the substrate. In some embodiments, the grating structure of the external surface of the substrate covers about 50% to about 70%, about 50% to about 80%, about 50% to about 90%, about 50% to about 95%, about 50% to about 99%, about 50% to about 100%, about 60% to about 80%, about 60% to about 90%, about 60% to about 95%, about 60% to about 99%, about 60% to about 100%, about 70% to about 90%, about 70% to about 95%, about 70% to about 99%, about 70% to about 100%, about 80% to about 95%, about 80% to about 99%, about 80% to about 100%, about 90% to about 95%, about 90% to about 99%, about 90% to about 100%, about 95% to about 99%, or about 95% to about 100% of the area of the external surface of the substrate.

In some embodiments, the grating structure of the interface between the substrate and the light extraction layer covers a significant portion of the interface. In some embodiments, the grating structure of the interface between the substrate and the light extraction layer covers at least about 50%, at least about 60%, at least about 70%, at least about 80%, at least about 90%, at least about 95%, at least about 99%, or about 100% of the area of the interface. In some embodiments, the grating structure of the interface between the substrate and the light extraction layer covers about 50% to about 70%, about 50% to about 80%, about 50% to about 90%, about 50% to about 95%, about 50% to about 99%, about 50% to about 100%, about 60% to about 80%, about 60% to about 90%, about 60% to about 95%, about 60% to about 99%, about 60% to about 100%, about 70% to about 90%, about 70% to about 95%, about 70% to about 99%, about 70% to about 100%, about 80% to about 95%, about 80% to about 99%, about 80% to about 100%, about 90% to about 95%, about 90% to about 99%, about 90% to about 100%, about 95% to about 99%, or about 95% to about 100% of the area of the interface between the substrate and the light extraction layer.

According to some embodiments, the OLED comprises a light extraction layer. In some embodiments, the light extraction layer is positioned between the substrate and a first electrode of the OLED. In some embodiments, the light extraction layer is positioned adjacent the substrate and/or the first electrode of the OLED. In certain embodiments, the light extraction layer is in direct physical contact with the substrate and/or the first electrode of the OLED.

In some embodiments, the light extraction layer comprises an inorganic material. Non-limiting examples of suitable materials for the light extraction layer include lithium fluoride (LiF), sodium fluoride (NaF), potassium fluoride (KF), and aluminum fluoride ($AlF_3$). In some embodiments, the light extraction layer comprises an aerogel.

In certain embodiments, the light extraction layer has a refractive index of about 1.45 or less, about 1.40 or less, about 1.35 or less, about 1.30 or less, about 1.25 or less, about 1.20 or less, about 1.15 or less, about 1.10 or less, about 1.05 or less, or about 1.00 or less. In some embodiments, the light extraction layer has a refractive index between about 1.00 and about 1.10, between about 1.00 and about 1.20, between about 1.00 and about 1.30, between about 1.00 and about 1.40, between about 1.00 and about 1.45, between about 1.10 and about 1.20, between about 1.10 and about 1.30, between about 1.10 and about 1.40, between about 1.10 and about 1.45, between about 1.20 and about 1.30, between about 1.20 and about 1.40, between about 1.20 and about 1.45, between about 1.30 and about 1.40, between about 1.30 and about 1.45, or between about 1.40 and about 1.45.

In some embodiments, the light extraction layer has a refractive index less than a refractive index of the substrate. In some embodiments, the difference between the refractive index of the light extraction layer and the refractive index of the substrate has a relatively large magnitude. In certain embodiments, the magnitude of the difference between the refractive index of the light extraction layer and the refractive index of the substrate is at least about 0.05, at least about 0.10, at least about 0.15, at least about 0.20, at least about 0.25, at least about 0.30, at least about 0.35, at least about 0.40, at least about 0.45, or at least about 0.50. In some embodiments, the magnitude of the difference between the refractive index of the light extraction layer and the refractive index of the substrate is between about 0.05 and about 0.10, between about 0.05 and about 0.15, between about 0.05 and about 0.20, between about 0.05 and about 0.25, between about 0.05 and about 0.30, between about 0.05 and about 0.35, between about 0.05 and about 0.40, between about 0.05 and about 0.45, between about 0.05 and about 0.50, between about 0.10 and about 0.20, between about 0.10 and about 0.25, between about 0.10 and about 0.30, between about 0.10 and about 0.35, between about 0.10 and about 0.40, between about 0.10 and about 0.45, between about 0.10 and about 0.50, between about 0.20 and about 0.30, between about 0.20 and about 0.35, between about 0.20 and about 0.40, between about 0.20 and about 0.45, between about 0.20 and about 0.50, between about 0.30 and about 0.40, between about 0.30 and about 0.45, between about 0.30 and about 0.50, or between about 0.40 and about 0.50.

In some embodiments, an interface between the light extraction layer and the first electrode comprises a grating structure. In some embodiments, the grating structure of the interface between the light extraction layer and the first electrode has an average periodicity. In some cases, the grating structure of the interface between the light extraction layer and the first electrode has an average periodicity of at least about 200 nm, at least about 300 nm, at least about 400 nm, at least about 500 nm, at least about 1000 nm, at least about 1500 nm, or at least about 2000 nm. In some embodiments, the grating structure of the interface between the light extraction layer and the first electrode has an average periodicity of about 2000 nm or less, about 1500 nm or less, about 1000 nm or less, about 500 nm or less, about 400 nm or less, about 300 nm or less, or about 200 nm or less. In certain embodiments, the grating structure of the interface between the light extraction layer and the first electrode has an average periodicity between about 200 nm and about 500 nm, between about 200 nm and about 1000 nm, between about 200 nm and about 1500 nm, between about 200 nm and about 2000 nm, between about 300 nm and about 500 nm, between about 300 nm and about 1000 nm, between about 300 nm and about 1500 nm, between about 300 nm and about 2000 nm, between about 400 nm and about 1000 nm, between about 400 nm and about 1500 nm, between about 400 nm and about 2000 nm, between about 500 nm and about 1000 nm, between about 500 nm and about 1500 nm, between about 500 nm and about 2000 nm, between about 1000 nm and about 1500 nm, between about 1000 nm and about 2000 nm, or between about 1500 nm and about 2000 nm.

In some embodiments, the grating structure of the interface between the light extraction layer and the first electrode has an average amplitude. In some embodiments, the grating structure of the interface between the light extraction layer and the first electrode has an average amplitude of at least about 30 nm, at least about 50 nm, at least about 70 nm, at least about 90 nm, at least about 100 nm, at least about 130 nm, or at least about 150 nm. In some embodiments, the grating structure of the interface between the light extraction layer and the first electrode has an average amplitude of about 150 nm or less, about 130 nm or less, about 100 nm or less, about 90 nm or less, about 70 nm or less, about 50 nm or less, or about 30 nm or less. In certain embodiments, the grating structure of the interface between the light extraction layer and the first electrode has an average amplitude between about 30 nm and about 50 nm, between about 30 nm and about 100 nm, between about 30 nm and about 150 nm, between about 50 nm and about 100 nm, between about 50 nm and about 150 nm, or between about 100 nm and about 150 nm.

In some embodiments, the grating structure of the interface between the light extraction layer and the first electrode covers a significant portion of the interface. In some embodiments, the grating structure of the interface between the light extraction layer and the first electrode covers at least about 50%, at least about 60%, at least about 70%, at least about 80%, at least about 90%, at least about 95%, at least about 99%, or about 100% of the area of the interface. In some embodiments, the grating structure of the interface between the light extraction layer and the first electrode covers between about 50% and about 60%, about 50% to about 70%, about 50% to about 80%, about 50% to about 90%, about 50% to about 95%, about 50% to about 99%, about 50% to about 100%, about 60% to about 70%, about 60% to about 80%, about 60% to about 90%, about 60% to about 95%, about 60% to about 99%, about 60% to about 100%, about 70% to about 80%, about 70% to about 90%, about 70% to about 95%, about 70% to about 99%, about 70% to about 100%, about 80% to about 90%, about 80% to about 95%, about 80% to about 99%, about 80% to about 100%, about 90% to about 95%, about 90% to about 99%, about 90% to about 100%, about 95% to about 99%, or about 95% to about 100% of the area of the interface.

In some embodiments, the light extraction layer is at least partially transparent to a peak wavelength of light generated by a light-emitting layer of the OLED. In certain embodiments, the light extraction layer transmits at least about 70%, at least about 75%, at least about 80%, at least about 85%, at least about 90%, a least about 95%, at least about 99%, or about 100% of a peak wavelength of light generated by the light-emitting layer of the OLED. In some embodiments, the light extraction layer transmits between about 70% to about 100%, about 75% to about 100%, about 80% to about 100%, about 85% to about 100%, about 90% to about 100%. or about 95% to about 100% of a peak wavelength of light generated by the light-emitting layer of the OLED. In some embodiments, the light extraction layer is at least partially transparent to a peak wavelength between about 380 nm and about 450 nm, between about 380 nm and about 495 nm, between about 380 nm and about 570 nm, between about 380 nm and about 590 nm, between about 380 nm and about 620 nm, between about 380 nm and about 700 nm, between about 380 nm and about 750 nm, between about 400 nm and about 450 nm, between about 400 nm and about 495 nm, between about 400 nm and about 570 nm, between about 400 nm and about 590 nm, between about 400 nm and about 620 nm, between about 400 nm and about 700 nm, between about 400 nm and about 750 nm, between about 450 nm and about 495 nm, between about 450 nm and about 570 nm, between about 450 nm and about 590 nm, between about 450 nm and about 620 nm, between about 450 nm and about 700 nm, between about 450 nm and about 750 nm, between about 495 nm and about 570 nm, between about 495 nm and about 590 nm, between about 495 nm and about 620 nm, between about 495 nm and about 700 nm, between about 495 nm and about 750 nm, between about 570 nm and about 590 nm, between about 570 nm and about 620 nm, between about 570 nm and about 700 nm, between about 570 nm and about 750 nm, between about 590 nm and about 620 nm, between about 590 nm and about 700 nm, between about 590 nm and about 750 nm, between about 620 nm and about 700 nm, between about 620 nm and about 750 nm, or between about 700 nm and about 750 nm. In some embodiments, the light extraction layer is at least partially transparent to at least a portion of the visible spectrum (e.g., about 400 nm to about 700 nm).

The light extraction layer may have any suitable thickness. In some embodiments, the light extraction layer has a thickness of at least about 20 nm, at least about 50 nm, at least about 100 nm, or at least about 150 nm. In some embodiments, the light extraction layer has a thickness of about 150 nm or less, about 100 nm or less, about 50 nm or less, or about 20 nm or less. In some embodiments, the light extraction layer has a thickness between about 20 nm and about 50 nm, between about 20 nm and about 100 nm, between about 20 nm and about 150 nm, between about 50 nm and about 100 nm, between about 50 nm and about 150 nm, or between about 100 nm and about 150 nm.

According to some embodiments, the OLED comprises a first electrode. In certain embodiments, the first electrode is an anode. In some cases, the first electrode is positioned adjacent the light extraction layer. In some cases, the first electrode is positioned in direct physical contact with the light extraction layer. Non-limiting examples of suitable materials for the first electrode include indium tin oxide (ITO), indium zinc oxide (IZO), aluminum tin oxide (ATO), aluminum zinc oxide (AZO), carbon nanotubes, silver nanowires, and combinations thereof.

In certain embodiments, the first electrode has a refractive index of at least about 1.70, at least about 1.75, at least about 1.80, at least about 1.85, at least about 1.90, at least about 1.95, at least about 2.00, or at least about 2.10. In some embodiments, the first electrode has a refractive index between about 1.70 and about 1.80, between about 1.70 and about 1.85, between about 1.70 and about 1.90, between about 1.70 and about 1.95, between about 1.70 and about 2.00, between about 1.70 and about 2.10, between about 1.75 and about 1.85. between about 1.75 and about 1.90, between about 1.75 and about 1.95, between about 1.75 and about 2.00, between about 1.75 and about 2.10, between about 1.80 and about 1.90, between 1.80 and about 1.95, between about 1.80 and about 2.00, between about 1.80 and about 2.10, between about 1.85 and about 1.95, between about 1.85 and about 2.00, between about 1.85 and about 2.10, between about 1.90 and about 2.00, or between about 1.90 and about 2.10.

In some embodiments, the light extraction layer has a refractive index less than a refractive index of the first electrode. In some embodiments, the magnitude of the difference between the refractive index of the light extraction layer and the refractive index of the first electrode is relatively large. In certain embodiments, the magnitude of the difference between the refractive index of the light extraction layer and the refractive index of the first electrode is at least about 0.30, at least about 0.35, at least about 0.40, at least about 0.45, at least about 0.50, at least about 0.55, at least about 0.60, at least about 0.65, at least about 0.70, at least about 0.75, at least about 0.80, at least about 0.85, at least about 0.90, at least about 0.95, or at least about 1.0. In some embodiments, the magnitude of the difference between the refractive index of the light extraction layer and the refractive index of the first electrode is between about 0.30 and about 0.40, about 0.30 to about 0.45, about 0.30 to about 0.50, about 0.30 to about 0.55, about 0.30 to about 0.60, about 0.30 to about 0.65, about 0.30 to about 0.70, about 0.30 to about 0.75, about 0.30 to about 0.80, about 0.30 to about 0.85, about 0.30 to about 0.90, about 0.30 to about 0.95, about 0.30 to about 1.0, about 0.40 to about 0.50, about 0.40 to about 0.55, about 0.40 to about 0.60, about 0.40 to about 0.65, about 0.40 to about 0.70, about 0.40 to about 0.75, about 0.40 to about 0.80, about 0.40 to about 0.85, about 0.40 to about 0.90, about 0.40 to about 0.95, about 0.40 to about 1.0, about 0.50 to about 0.60, about 0.50 to about 0.65, about 0.50 to about 0.70, about 0.50 to about 0.75, about 0.50 to about 0.80, about 0.50 to about 0.85, about 0.50 to about 0.90, about 0.50 to about 0.95, about 0.50 to about 1.0, about 0.60 to about 0.70, about 0.60 to about 0.75, about 0.60 to about 0.80, about 0.60 to about 0.85, about 0.60 to about 0.90, about 0.60 to about 0.95, about 0.60 to about 1.0, about 0.70 to about 0.80, about 0.70 to about 0.85, about 0.70 to about 0.90, about 0.70 to about 0.95, about 0.70 to about 1.0, about 0.80 to about 0.90, about 0.80 to about 0.95, about 0.80 to about 1.0, or about 0.90 to about 1.0.

In certain embodiments, an interface between the first electrode and the one or more organic layers comprises a grating structure. In certain other embodiments, however, the interface between the first electrode and the one or more organic layers does not comprise a grating structure (e.g., the interface may be substantially planar). In embodiments in which the interface between the first electrode and the one or more organic layers comprises a grating structure, the grating structure of the interface may have an average periodicity. In some cases, the grating structure of the interface between the first electrode and the one or more organic layers has an average periodicity of at least about 200 nm, at least about 300 nm, at least about 400 nm, at least about 500 nm, at least about 1000 nm, at least about 1500 nm, or at least about 2000 nm. In some embodiments, the grating structure of the interface between the first electrode and the one or more organic layers has an average periodicity of about 2000 nm or less, about 1500 nm or less, about 1000 nm or less, about 500 nm or less, about 400 nm or less, about 300 nm or less, or about 200 nm or less. In certain embodiments, the grating structure of the interface between the first electrode and the one or more organic layers has an average periodicity between about 200 nm and about 500 nm, between about 200 nm and about 1000 nm, between about 200 nm and about 1500 nm, between about 200 nm and about 2000 nm, between about 300 nm and about 500 nm, between about 300 nm and about 1000 nm, between about 300 nm and about 1500 nm, between about 300 nm and about 2000 nm, between about 400 nm and about 1000 nm, between about 400 nm and about 1500 nm, between about 400 nm and about 2000 nm, between about 500 nm and about 1000 nm, between about 500 nm and about 1500 nm, between about 500 nm and about 2000 nm, between about 1000 nm and about 1500 nm, between about 1000 nm and about 2000 nm, or between about 1500 nm and about 2000 nm.

In some embodiments, the grating structure of the interface between the first electrode and the one or more organic layers has an average amplitude. In some embodiments, the grating structure of the interface between the first electrode and the one or more organic layers has an average amplitude of at least about 30 nm, at least about 50 nm, at least about 70 nm, at least about 90 nm, at least about 100 nm, at least about 130 nm, or at least about 150 nm. In some embodiments, the grating structure of the interface between the first electrode and the one or more organic layers has an average amplitude of about 150 nm or less, about 130 nm or less, about 100 nm or less, about 90 nm or less, about 70 nm or less, about 50 nm or less, or about 30 nm or less. In certain embodiments, the grating structure of the interface between the first electrode and the one or more organic layers has an average amplitude in between about 30 nm and about 50 nm, between about 30 nm and about 100 nm, between about 30 nm and about 150 nm, between about 50 nm and about 100 nm, between about 50 nm and about 150 nm, or between about 100 nm and about 150 nm.

In some embodiments, the grating structure of the interface between the first electrode and the one or more organic layers covers at least about 50%, at least about 60%, at least about 70%, at least about 80%, at least about 90%, at least about 95%, at least about 99%, or about 100% of the area of the interface. In some embodiments, the grating structure of the interface between the first electrode and the one or more organic layers covers between about 50% and about 60%, about 50% to about 70%, about 50% to about 80%, about 50% to about 90%, about 50% to about 95%, about 50% to about 99%, about 50% to about 100%, about 60% to about 70%, about 60% to about 80%, about 60% to about 90%, about 60% to about 95%, about 60% to about 99%, about 60% to about 100%, about 70% to about 80%, about 70% to about 90%, about 70% to about 95%, about 70% to about 99%, about 70% to about 100%, about 80% to about 90%, about 80% to about 95%, about 80% to about 99%, about 80% to about 100%, about 90% to about 95%, about 90% to about 99%, about 90% to about 100%, about 95% to about 99%, or about 95% to about 100% of the area of the interface.

In some embodiments, the first electrode is at least partially transparent to a peak wavelength of light generated by a light-emitting layer of the OLED. In certain embodiments, the first electrode transmits at least about 70%, at least about 75%, at least about 80%, at least about 85%, at least about 90%, a least about 95%, at least about 99%, or about 100% of a peak wavelength of light generated by a light-emitting layer of the OLED. In some embodiments, the first electrode transmits between about 70% to about 100%, about 75% to about 100%, about 80% to about 100%, about 85% to about 100%, about 90% to about 100%, or about 95% to about 100% of a peak wavelength of light generated by a light-emitting layer of the OLED. In some embodiments, the first electrode is at least partially transparent to a peak wavelength between about 380 nm and about 450 nm, between about 380 nm and about 495 nm, between about 380 nm and about 570 nm, between about 380 nm and about 590 nm, between about 380 nm and about 620 nm, between about 380 nm and about 700 nm, between about 380 nm and about 750 nm, between about 400 nm and about 450 nm, between about 400 nm and about 495 nm, between about 400 nm and about 570 nm, between about 400 nm and about 590 nm, between about 400 nm and about 620 nm, between about 400 nm and about 700 nm, between about 400 nm and about 750 nm, between about 450 nm and about 495 nm, between about 450 nm and about 570 nm, between about 450 nm and about 590 nm, between about 450 nm and about 620 nm, between about 450 nm and about 700 nm, between about 450 nm and about 750 nm, between about 495 nm and about 570 nm, between about 495 nm and about 590 nm, between about 495 nm and about 620 nm, between about 495 nm and about 700 nm, between about 495 nm and about 750 nm, between about 570 nm and about 590 nm, between about 570 nm and about 620 nm, between about 570 nm and about 700 nm, between about 570 nm and about 750 nm, between about 590 nm and about 620 nm, between about 590 nm and about 700 nm, between about 590 nm and about 750 nm, between about 620 nm and about 700 nm, between about 620 nm and about 750 nm, or between about 700 nm and about 750 nm. In some embodiments, the first electrode is at least partially transparent to at least a portion of the visible spectrum (e.g., about 400 nm to about 700 nm).

According to some embodiments, the OLED comprises one or more organic layers (i.e., one or more layers comprising an organic material). In some embodiments, the one or more organic layers are positioned between the first electrode (e.g., the anode) and the second electrode (e.g., the cathode). In certain embodiments, the one or more organic layers are positioned adjacent the first electrode and/or the second electrode. In certain cases, the one or more organic layers are in direct physical contact with the first electrode and/or the second electrode.

An average refractive index of the one or more organic layers generally refers to the number average of the refractive indices of the one or more organic layers (i.e., the sum of the refractive indices of the one or more organic layers divided by the number of layers). In some embodiments, the one or more organic layers have an average refractive index of at least about 1.60, at least about 1.65, at least about 1.70, at least about 1.75, at least about 1.80, at least about 1.85, at least about 1.90, at least about 1.95, or at least about 2.0. In some embodiments, the one or more organic layers have an average refractive index of about 2.0 or less, about 1.95 or less, about 1.90 or less, about 1.85 or less, about 1.80 or less, about 1.75 or less, about 1.70 or less, about 1.65 or less, or about 1.60 or less. In some embodiments, the one or more organic layers have an average refractive index between about 1.60 and 1.70, between about 1.60 and 1.75, between about 1.60 and about 1.80, between about 1.60 and about 1.85, between about 1.60 and about 1.90, between about 1.60 and about 1.95, between about 1.60 and about 2.0, between about 1.70 and about 1.80, between about 1.70 and about 1.85. between about 1.70 and about 1.90, between about 1.70 and about 1.95, between about 1.70 and about 2.0, between about 1.80 and about 1.90, between about 1.80 and about 1.95, between about 1.80 and about 2.0, or between about 1.90 and about 2.0.

In some embodiments, the magnitude of the difference between the average refractive index of the one or more organic layers and the refractive index of the first electrode is relatively small In certain embodiments, the magnitude of the difference between the average refractive index of the one or more organic layers and the refractive index of the first electrode is about 0.30 or less, about 0.25 or less, about 0.20 or less, about 0.15 or less, about 0.10 or less, or about 0.05 or less. In some embodiments, the magnitude of the difference between the average refractive index of the one or more organic layers and the refractive index of the first electrode is between about 0 and about 0.30, between about 0 and about 0.25, between about 0 and about 0.20, between about 0 and about 0.15, between about 0 and about 0.10, or between about 0 and about 0.05.

In some embodiments, each layer of the one or more organic layers has a refractive index of at least about 1.60, at least about 1.65, at least about 1.70, at least about 1.75, at least about 1.80, at least about 1.85, at least about 1.90, at least about 1.95, or at least about 2.0. In some embodiments, each layer of the one or more organic layers has a refractive index of about 2.0 or less, about 1.95 or less, about 1.90 or less, about 1.85 or less, about 1.80 or less, about 1.75 or less, about 1.70 or less, about 1.65 or less, or about 1.60 or less. In some embodiments, each layer of the one or more organic layers has a refractive index between about 1.60 and 1.70, between about 1.60 and 1.75, between about 1.60 and about 1.80, between about 1.60 and about 1.85, between about 1.60 and about 1.90, between about 1.60 and about 1.95, between about 1.60 and about 2.0, between about 1.70 and about 1.80, between about 1.70 and about 1.85, between about 1.70 and about 1.90, between about 1.70 and about 1.95, between about 1.70 and about 2.0, between about 1.80 and about 1.90, between about 1.80 and about 1.95, between about 1.80 and about 2.0, or between about 1.90 and about 2.0.

In some embodiments, the one or more organic layers comprise a light-emitting layer (i.e., at least one layer of the one or more organic layers is a light-emitting layer). In some embodiments, the light-emitting layer generates visible light (e.g., electromagnetic radiation having a wavelength between about 400 nm to about 700 nm). In certain cases, the light-emitting layer generates substantially blue light (e.g., light having a peak wavelength between about 450 nm and about 495 nm), substantially green light (e.g., light having a peak wavelength between about 495 nm and about 570 nm), and/or substantially red light (e.g., light having a peak wavelength between about 620 nm and 750 nm). In certain embodiments, the light-emitting layer generates light having a peak wavelength in a range between about 380 nm and about 450 nm, between about 380 nm and about 495 nm, between about 380 nm and about 570 nm, between about 380 nm and about 590 nm, between about 380 nm and about 620 nm, between about 380 nm and about 700 nm, between about 380 nm and about 750 nm, between about 400 nm and about 450 nm, between about 400 nm and about 495 nm, between about 400 nm and about 570 nm, between about 400 nm and about 590 nm, between about 400 nm and about 620 nm, between about 400 nm and about 700 nm, between about 400 nm and about 750 nm, between about 450 nm and about 495 nm, between about 450 nm and about 570 nm, between about 450 nm and about 590 nm, between about 450 nm and about 620 nm, between about 450 nm and about 700 nm, between about 450 nm and about 750 nm, between about 495 nm and about 570 nm, between about 495 nm and about 590 nm, between about 495 nm and about 620 nm, between about 495 nm and about 700 nm, between about 495 nm and about 750 nm, between about 570 nm and about 590 nm, between about 570 nm and about 620 nm, between about 570 nm and about 700 nm, between about 570 nm and about 750 nm, between about 590 nm and about 620 nm, between about 590 nm and about 700 nm, between about 590 nm and about 750 nm, between about 620 nm and about 700 nm, between about 620 nm and about 750 nm, or between about 700 nm and about 750 nm.

Non-limiting examples of suitable materials for the light-emitting layer include tris-(8-hydroxyquinoline)aluminum ("Alq$_3$"); fac-tris(2-phenylpyridinato)iridium(III) ("Ir(ppy)$_3$"); iridium (III) bis[(4,6-difluorophenyl)-pyridinate-N,C$^{2'}$] picolinate ("FIrpic"); 3,5'-N,N'-dicarbazole-benzene ("mCP"); poly-[2-methoxy-5-(2'-ethyl-hexyloxy) phenylene vinylene] ("MEH-PPV"); mCP doped with tris(2-phenylisoquinoline)iridium ("Ir(piq)$_3$"); mCP doped with Ir(ppy)$_3$; mCP doped with FIrpic; Ir(ppy)$_3$ doped with 4,4'-bis(N-carbazolyl)-1,1'-biphenyl ("CBP"); and Ir(ppy)$_3$ doped with tris(4-carbazoyl-9-ylphenyl)amine ("TCTA").

In certain embodiments, the one or more organic layers comprise two or more light-emitting layers. In some cases, the two or more light-emitting layers generate light having substantially the same wavelength. In some cases, the two or more light-emitting layers generate light having substantially different wavelengths. For example, in certain embodiments, at least one of the light-emitting layers may generate substantially red light, and one or more additional light-emitting layers may generate substantially blue and/or substantially green light. In certain embodiments, at least one of the light-emitting layers may generate substantially green light, and one or more additional light-emitting layers may generate substantially blue and/or substantially red light. In certain embodiments, at least one of the light-emitting layers may generate substantially blue light, and one or more additional light-emitting layers may generate substantially red and/or substantially green light.

In some embodiments, the one or more organic layers comprise a hole transport layer (HTL). An HTL generally refers to a layer that facilitates hole transport between two or more layers of a device. In some embodiments, the HTL is positioned between a first electrode (e.g., an anode) and a light-emitting layer of the OLED. In certain cases, the HTL is in direct physical contact with a first electrode and/or a light-emitting layer of the OLED. In certain embodiments, the HTL facilitates the transport of holes from the first electrode to the light-emitting layer. Non-limiting examples of suitable materials for the HTL include 1,1'-bis[(di-4-tolylamino)phenyl] cyclohexane (TAPC), N,N'-diphenyl-N,N'(2-naphthyl)-(1,1'-phenyl)-4,4'-diamine (NPB), and N,N'-diphenyl-N,N'-di(m-tolyl)benzidine (TPD).

In some embodiments, the one or more organic layers comprise a hole injection layer (HIL). An HIL generally refers to a layer that promotes the injection of holes into a light-emitting layer of the OLED. In certain cases, for example, the presence of an HIL in an OLED may lower the energy barrier between a first layer (e.g., a first electrode) and a second layer (e.g., an organic layer) of the OLED (e.g., the HIL may have a highest occupied molecular orbital (HOMO) between the workfunction of the first electrode and the HOMO of the organic layer). In some embodiments, the HIL is positioned between a first electrode (e.g., an anode) and a light-emitting layer of the OLED. In some embodiments, the HIL is positioned between a first electrode (e.g., an anode) and an HTL of the OLED. In certain cases, the HIL is in direct physical contact with the first electrode and/or the HTL of the OLED. A non-limiting example of a suitable material for the HIL is poly(3,4-ethylenedioxythiophene) polystyrene sulfonate (PEDOT:PSS).

In some embodiments, the one or more organic layers comprise an electron transport layer (ETL). An ETL generally refers to a layer that facilitates electron transport between two or more layers of a device. In some embodiments, the ETL is positioned between a light-emitting layer and a second electrode (e.g., a cathode) of the OLED. In certain cases, the ETL is in direct physical contact with the light-emitting layer and/or the second electrode. In certain embodiments, the ETL facilitates the transport of electrons from the second electrode to the light-emitting layer. Examples of suitable materials for the ETL include, but are not limited to, tris[3-(3-pyridyl)-mesityl]borane (3TPYMB), cesium-doped 3TPYMB (3TPYMB:Cs), 2,9-dimethyl-4,7-diphenyl-1,10-phenanthroline (BCP), 4,7-diphenyl-1,10-phenanthroline (BPhen), and tris-(8-hydroxy quinoline) aluminum ($Alq_3$). In some embodiments, the ETL as a thickness of at least about 50 nm, at least about 55 nm, at least about 60 nm, at least about 100 nm, at least about 150 nm, at least about 200 nm, at least about 240 nm, or at least about 250 nm. In some embodiments, the ETL has a thickness of about 250 nm or less, about 240 nm or less, about 200 nm or less, about 150 nm or less, about 100 nm or less, about 60 nm or less, about 55 nm or less, or about 50 nm or less. In some embodiments, the ETL has a thickness in a range between about 50 nm to about 100 nm, about 50 nm to about 150 nm, about 50 nm to about 200 nm, about 50 nm to about 250 nm, about 100 nm to about 150 nm, about 100 nm to about 200 nm, about 100 nm to about 250 nm, about 150 nm to about 200 nm, about 150 nm to about 250 nm, or about 200 nm to about 250 nm.

In some embodiments, the one or more organic layers comprise an electron injection layer (EIL). An EIL generally refers to a layer that promotes the injection of electrons into a light-emitting layer of the OLED. In certain cases, for example, the presence of an EIL in an OLED may lower the energy barrier between a first layer (e.g., an organic layer) and a second layer (e.g., a second electrode) of the OLED (e.g., the EIL may have a lowest unoccupied molecular orbital (LUMO) between the workfunction of the second electrode and the LUMO of the organic layer). In some embodiments, the EIL is positioned between a second electrode (e.g., a cathode) and a light-emitting layer of the OLED. In some embodiments, the EIL is positioned between a second electrode (e.g., a cathode) and an ETL of the OLED. In certain cases, the EIL is in direct physical contact with the second electrode and the ETL of the OLED. Non-limiting examples of suitable materials for the EIL include cesium-doped 3TPYMB (3TPYMB:Cs), lithium-doped 3TPYMB (3TPYMB:Li), cesium-doped BPhen (BPhen:Cs), and lithium-doped BPhen (BPhen:Li).

In certain embodiments, one or more interfaces between the one or more organic layers (e.g., an interface between a hole transport layer and a light-emitting layer, an interface between a hole injection layer and a hole transport layer, an interface between a light-emitting layer and an electron transport layer, an interface between an electron injection layer and an electron transport layer) may comprise a grating structure. In certain embodiments, one or more interfaces between the one or more organic layers may not comprise a grating structure (e.g., the one or more interfaces may be substantially planar). In embodiments in which one or more interfaces between the one or more organic layers comprise a grating structure, the grating structure of the interface between two layers of the one or more organic layers has an average periodicity of at least about 200 nm, at least about 300 nm, at least about 400 nm, at least about 500 nm, at least about 1000 nm, at least about 1500 nm, or at least about 2000 nm. In some embodiments, the grating structure of the interface between two layers of the one or more organic layers has an average periodicity of about 2000 nm or less, about 1500 nm or less, about 1000 nm or less, about 500 nm or less, about 400 nm or less, about 300 nm or less, or about 200 nm or less. In certain embodiments, the grating structure of the interface between two layers of the one or more organic layers has an average periodicity between about 200 nm and about 500 nm, between about 200 nm and about 1000 nm, between about 200 nm and about 1500 nm, between about 200 nm and about 2000 nm, between about 300 nm and about 500 nm, between about 300 nm and about 1000 nm, between about 300 nm and about 1500 nm, between about 300 nm and about 2000 nm, between about 400 nm and about 1000 nm, between about 400 nm and about 1500 nm, between about 400 nm and about 2000 nm, between about 500 nm and about 1000 nm, between about 500 nm and about 1500 nm, between about 500 nm and about 2000 nm, between about 1000 nm and about 1500 nm, between about 1000 nm and about 2000 nm, or between about 1500 nm and about 2000 nm.

In some embodiments, the grating structure of the interface between two layers of the one or more organic layers has an average amplitude of at least about 30 nm, at least about 50 nm, at least about 70 nm, at least about 90 nm, at least about 100 nm, at least about 130 nm, or at least about 150 nm. In some embodiments, the grating structure of the interface between two layers of the one or more organic layers has an average amplitude of about 150 nm or less, about 130 nm or less, about 100 nm or less, about 90 nm or less, about 70 nm or less, about 50 nm or less, or about 30 nm or less. In certain embodiments, the grating structure of the interface between two layers of the one or more organic layers has an average amplitude between about 30 nm and about 50 nm, between about 30 nm and about 100 nm, between about 30 nm and about 150 nm, between about 50 nm and about 100 nm, between about 50 nm and about 150 nm, or between about 100 nm and about 150 nm.

In certain embodiments, an interface between the one or more organic layers and the second electrode comprises a grating structure. In certain other embodiments, however, the interface between the one or more organic layers and the second electrode does not comprise a grating structure (e.g., the interface may be substantially planar). In embodiments in which the interface between the one or more organic layers and the second electrode comprises a grating structure, the grating structure of the interface may have an average periodicity. In some cases, the grating structure of the interface between the one or more organic layers and the second electrode has an average periodicity of at least about 200 nm, at least about 300 nm, at least about 400 nm, at least about 500 nm, at least about 1000 nm, at least about 1500 nm, or at least about 2000 nm. In some embodiments, the grating structure of the interface between the one or more organic layers and the second electrode has an average periodicity of about 2000 nm or less, about 1500 nm or less, about 1000 nm or less, about 500 nm or less, about 400 nm or less, about 300 nm or less, or about 200 nm or less. In certain embodiments, the grating structure n of the interface between the one or more organic layers and the second electrode has an average periodicity between about 200 nm and about 500 nm, between about 200 nm and about 1000 nm, between about 200 nm and about 1500 nm, between about 200 nm and about 2000 nm, between about 300 nm and about 500 nm, between about 300 nm and about 1000 nm, between about 300 nm and about 1500 nm, between about 300 nm and about 2000 nm, between about 400 nm and about 1000 nm, between about 400 nm and about 1500 nm, between about 400 nm and about 2000 nm, between about 500 nm and about 1000 nm, between about 500 nm and about 1500 nm, between about 500 nm and about 2000 nm, between about 1000 nm and about 1500 nm, between about 1000 nm and about 2000 nm, or between about 1500 nm and about 2000 nm.

In some embodiments, the grating structure of the interface between the one or more organic layers and the second electrode has an average amplitude. In some embodiments, the grating structure of the interface between the one or more organic layers and the second electrode has an average amplitude of at least about 30 nm, at least about 50 nm, at least about 70 nm, at least about 90 nm, at least about 100 nm, at least about 130 nm, or at least about 150 nm. In some embodiments, the grating structure of the interface between the one or more organic layers and the second electrode has an average amplitude of about 150 nm or less, about 130 nm or less, about 100 nm or less, about 90 nm or less, about 70 nm or less, about 50 nm or less, or about 30 nm or less. In certain embodiments, the grating structure of the interface between the one or more organic layers and the second electrode has an average amplitude between about 30 nm and about 50 nm, between about 30 nm and about 100 nm, between about 30 nm and about 150 nm, between about 50 nm and about 100 nm, between about 50 nm and about 150 nm, or between about 100 nm and about 150 nm.

In some embodiments, the grating structure of the interface between the one or more organic layers and the second electrode covers at least about 50%, at least about 60%, at least about 70%, at least about 80%, at least about 90%, at least about 95%, at least about 99%, or about 100% of the area of the interface. In some embodiments, the grating structure of the interface between the one or more organic layers and the second electrode covers between about 50% and about 60%, about 50% to about 70%, about 50% to about 80%, about 50% to about 90%, about 50% to about 95%, about 50% to about 99%, about 50% to about 100%, about 60% to about 70%, about 60% to about 80%, about 60% to about 90%, about 60% to about 95%, about 60% to about 99%, about 60% to about 100%, about 70% to about 80%, about 70% to about 90%, about 70% to about 95%, about 70% to about 99%, about 70% to about 100%, about 80% to about 90%, about 80% to about 95%, about 80% to about 99%, about 80% to about 100%, about 90% to about 95%, about 90% to about 99%, about 90% to about 100%, about 95% to about 99%, or about 95% to about 100% of the area of the interface.

According to some embodiments, the OLED comprises a second electrode. In certain embodiments, the second electrode is a cathode. In some cases, the second electrode is positioned adjacent at least one of the one or more organic layers. In some cases, the second electrode is positioned in direct physical contact with at least one of the one or more organic layers.

In some embodiments, the second electrode comprises a metal. In certain embodiments, the second electrode comprises a transparent conductive oxide. Examples of suitable materials for the cathode include, but are not limited to, aluminum, silver, gold, titanium, tungsten, magnesium, calcium, barium, ITO, LiF/Al, LiF/Al/ITO, Ag/ITO, $CsCO_3$/ITO, Ba/Al, and combinations thereof.

In some embodiments, the second electrode at least partially reflects a peak wavelength of light generated by a light-emitting layer of the OLED. In certain embodiments, the second electrode reflects at least about 70%, at least about 75%, at least about 80%, at least about 85%, at least about 90%, a least about 95%, at least about 99%, or about 100% of a peak wavelength of light generated by a light-emitting layer of the OLED. In some embodiments, the second electrode reflects between about 70% to about 100%, about 75% to about 100%, about 80% to about 100%, about 85% to about 100%, about 90% to about 100%, or about 95% to about 100% of a peak wavelength of light generated by a light-emitting layer of the OLED. In some embodiments, the second electrode at least partially reflects a peak wavelength between about 380 nm and about 450 nm, between about 380 nm and about 495 nm, between about 380 nm and about 570 nm, between about 380 nm and about 590 nm, between about 380 nm and about 620 nm, between about 380 nm and about 700 nm, between about 380 nm and about 750 nm, between about 400 nm and about 450 nm, between about 400 nm and about 495 nm, between about 400 nm and about 570 nm, between about 400 nm and about 590 nm, between about 400 nm and about 620 nm, between about 400 nm and about 700 nm, between about 400 nm and about 750 nm, between about 450 nm and about 495 nm, between about 450 nm and about 570 nm, between about 450 nm and about 590 nm, between about 450 nm and about 620 nm, between about 450 nm and about 700 nm, between about 450 nm and about 750 nm, between about 495 nm and about 570 nm, between about 495 nm and about 590 nm, between about 495 nm and about 620 nm, between about 495 nm and about 700 nm, between about 495 nm and about 750 nm, between about 570 nm and about 590 nm, between about 570 nm and about 620 nm, between about 570 nm and about 700 nm, between about 570 nm and about 750 nm, between about 590 nm and about 620 nm, between about 590 nm and about 700 nm, between about 590 nm and about 750 nm, between about 620 nm and about 700 nm, between about 620 nm and about 750 nm, or between about 700 nm and about 750 nm. In some embodiments, the second electrode at least partially reflects at least a portion of the visible spectrum (e.g., about 400 nm to about 700 nm).

In some embodiments, the second electrode is at least partially transparent to a peak wavelength of light generated by a light-emitting layer of the OLED. In certain embodiments, the second electrode transmits at least about 70%, at least about 75%, at least about 80%, at least about 85%, at least about 90%, a least about 95%, at least about 99%, or about 100% of a peak wavelength of light generated by a light-emitting layer of the OLED. In some embodiments, the second electrode transmits between about 70% to about 100%, about 75% to about 100%, about 80% to about 100%, about 85% to about 100%, about 90% to about 100%, or about 95% to about 100% of a peak wavelength of light generated by a light-emitting layer of the OLED. In some embodiments, the second electrode is at least partially transparent to a peak wavelength between about 380 nm and about 450 nm, between about 380 nm and about 495 nm, between about 380 nm and about 570 nm, between about 380 nm and about 590 nm, between about 380 nm and about 620 nm, between about 380 nm and about 700 nm, between about 380 nm and about 750 nm, between about 400 nm and about 450 nm, between about 400 nm and about 495 nm, between about 400 nm and about 570 nm, between about 400 nm and about 590 nm, between about 400 nm and about 620 nm, between about 400 nm and about 700 nm, between about 400 nm and about 750 nm, between about 450 nm and about 495 nm, between about 450 nm and about 570 nm, between about 450 nm and about 590 nm, between about 450 nm and about 620 nm, between about 450 nm and about 700 nm, between about 450 nm and about 750 nm, between about 495 nm and about 570 nm, between about 495 nm and about 590 nm, between about 495 nm and about 620 nm, between about 495 nm and about 700 nm, between about 495 nm and about 750 nm, between about 570 nm and about 590 nm, between about 570 nm and about 620 nm, between about 570 nm and about 700 nm, between about 570 nm and about 750 nm, between about 590 nm and about 620 nm, between about 590 nm and about 700 nm, between about 590 nm and about 750 nm, between about 620 nm and about 700 nm, between about 620 nm and about 750 nm, or between about 700 nm and about 750 nm. In some embodiments, the second electrode is at least partially transparent to at least a portion of the visible spectrum (e.g., about 400 nm to about 700 nm).

The second electrode may have any appropriate thickness. In some cases, the second electrode has a thickness of at least about 50 nm, at least about 75 nm, at least about 100 nm, at least about 125 nm, at least about 150 nm, at least about 175 nm, at least about 200 nm, at least about 225 nm, or at least about 250 nm. In certain embodiments, the second electrode has a thickness of about 250 nm or less, about 225 nm or less, about 200 nm or less, about 175 nm or less, about 150 nm or less, about 125 nm or less, about 100 nm or less, about 75 nm or less. or about 50 nm or less.

In certain embodiments, an external surface of the second electrode comprises a grating structure. In certain other embodiments, the external surface of the second electrode does not comprise a grating structure. In embodiments in which the external surface comprises a grating structure, the grating structure of the external surface of the second electrode has an average periodicity of at least about 200 nm, at least about 300 nm, at least about 400 nm, at least about 500 nm, at least about 1000 nm, at least about 1500 nm, or at least about 2000 nm. In some embodiments, the grating structure of the external surface of the second electrode has an average periodicity of about 2000 nm or less, about 1500 nm or less, about 1000 nm or less, about 500 nm or less, about 400 nm or less, about 300 nm or less, or about 200 nm or less. In certain embodiments, the grating structure of the external surface of the second electrode has an average periodicity between about 200 nm and about 500 nm, between about 200 nm and about 1000 nm, between about 200 nm and about 1500 nm, between about 200 nm and about 2000 nm, between about 300 nm and about 500 nm, between about 300 nm and about 1000 nm, between about 300 nm and about 1500 nm, between about 300 nm and about 2000 nm, between about 400 nm and about 1000 nm, between about 400 nm and about 1500 nm, between about 400 nm and about 2000 nm, between about 500 nm and about 1000 nm, between about 500 nm and about 1500 nm, between about 500 nm and about 2000 nm, between about 1000 nm and about 1500 nm, between about 1000 nm and about 2000 nm, or between about 1500 nm and about 2000 nm.

In some embodiments, the grating structure of the external surface of the second electrode has an average amplitude. In some embodiments, the grating structure of the external surface of the second electrode has an average amplitude of at least about 30 nm, at least about 50 nm, at least about 70 nm, at least about 90 nm, at least about 100 nm, at least about 130 nm, or at least about 150 nm. In some embodiments, the grating structure of the external surface of the second electrode has an average amplitude of about 150 nm or less, about 130 nm or less, about 100 nm or less, about 90 nm or less, about 70 nm or less, about 50 nm or less, or about 30 nm or less. In certain embodiments, the grating structure of the external surface of the second electrode has an average amplitude in a range of about 30 nm to about 50 nm, about 30 nm to about 100 nm, about 30 nm to about 150 nm, about 50 nm to about 100 nm, about 50 nm to about 150 nm, or about 100 nm to about 150 nm.

In some embodiments, the OLED further comprises a resin layer. In some embodiments, the resin layer is adjacent the substrate. In certain embodiments, the resin layer is in direct physical contact with the substrate. The resin layer may, according to some embodiments, be positioned between the substrate and the light extraction layer. In some cases, the refractive index of the resin layer is substantially similar to the refractive index of the substrate. In certain cases, for example, the magnitude of the difference between the refractive index of the resin layer and the refractive index of the substrate is about 0.5 or less, about 0.4 or less, about 0.3 or less, about 0.2 or less, about 0.1 or less, about 0.05 or less, about 0.02 or less, or about 0.01 or less. A non-limiting example of a suitable material for the resin layer is Norland Optical Adhesive 81.

In some embodiments, an external surface of the substrate has a relatively high surface roughness. In certain cases, a relatively rough external substrate surface may promote extraction of light from the substrate mode (e.g., outcoupling of light from the substrate mode to an external mode). In some cases, the external surface of the substrate may be modified to increase its surface roughness. For example, in certain embodiments, the external surface of the substrate may be sandblasted, abraded (e.g., mechanically abraded), and/or etched.

In certain embodiments, a surface roughness profile of the external surface of the substrate may be measured using a profilometer (e.g., a contact profilometer, an optical profilometer). From the surface roughness profile, root mean square surface roughness Rq may be calculated as follows:

$$\sqrt{\frac{1}{N}\sum_{i=1}^{N} R_i^2} \qquad (1)$$

where $R_i$ is the height at the $i^{th}$ point in a surface roughness profile and N is the number of points that were measured. In some cases, the external surface of the substrate has a root mean square surface roughness $R_q$ of at least about 1 nm, at least about 5 nm, at least about 10 nm, at least about 20 nm, at least about 50 nm, at least about 100 nm, at least about 150 nm, at least about 200 nm, at least about 250 nm, at least about 300 nm, at least about 400 nm, or at least about 500 nm. In some embodiments, the external surface of the substrate has a root mean square surface roughness $R_q$ of about 500 nm or less, about 400 nm or less, about 300 nm or less, about 250 nm or less, about 200 nm or less, about 150 nm or less, about 100 nm or less, about 50 nm or less, about 20 nm or less, about 10 nm or less, about 5 nm or less, or about 1 nm or less. In some embodiments, the second surface of the substrate has a root mean square surface roughness $R_q$ between about 1 nm and about 10 nm, between about 1 nm and about 20 nm, between about 1 nm and about 50 nm, between about 1 nm and about 100, between about 1 nm and about 150 nm, between about 1 nm and about 200 nm, between about 1 nm and about 250 nm, between about 1 nm and about 300 nm, between about 1 nm and about 400 nm, between about 1 nm and about 500 nm, between about 50 nm and about 100 nm, between about 50 nm and about 150 nm, between about 50 nm and about 200 nm, between about 50 nm and about 250 nm, between about 50 nm and about 300 nm, between about 50 nm and about 400 nm, between about 50 nm and about 500 nm, between about 100 nm and about 150 nm, between about 100 nm and about 200 nm, between about 100 nm and about 250 nm, between about 100 nm and about 300 nm, between about 100 nm and about 400 nm, between about 100 nm and about 500 nm, between about 200 nm and about 250 nm, between about 200 nm and about 300 nm, between about 200 nm and about 400 nm, between about 200 nm and about 500 nm, between about 300 nm and about 400 nm, between about 300 nm and about 500 nm, or between about 400 nm and about 500 nm.

According to some embodiments, the OLED further comprises a microlens array (e.g., a plurality of microlenses arranged in a pattern). In some cases, the microlens array may advantageously promote extraction of light from the substrate mode (e.g., outcoupling of light from the substrate mode to an external mode). In some embodiments, the microlens array is positioned adjacent an external surface of the substrate. The microlens array may, in some embodiments, be in direct physical contact with the external surface of the substrate.

In some embodiments, at least a portion of the microlenses of the microlens array are formed of a material having a relatively high refractive index. In some embodiments, at least a portion of the microlenses are formed of a material having a refractive index of at least about 1.4, at least about 1.5, at least about 1.6, at least about 1.7, or at least about 1.8. In some cases, at least a portion of the microlenses are formed of a material having a refractive index of about 1.80 or less, about 1.70 or less, about 1.60 or less, about 1.50 or less, or about 1.40 or less. At least a portion of the microlenses may, in some embodiments, have a refractive index in a range between about 1.40 and about 1.50, between about 1.40 and about 1.60, between about 1.40 and about 1.70, between about 1.40 and about 1.80, between about 1.50 and about 1.60, between about 1.50 and about 1.70, between about 1.50 and about 1.80, between about 1.60 and about 1.70, between about 1.60 and about 1.80. or between about 1.70 and about 1.80.

In some embodiments, at least a portion of the microlenses of the microlens array are formed of a material having a refractive index that is substantially similar to the refractive index of the substrate. In certain embodiments, the magnitude of the difference between the average refractive index of the microlenses of the microlens array and the refractive index of the substrate is about 0.30 or less, about 0.25 or less, about 0.20 or less, about 0.15 or less, about 0.10 or less, about 0.05 or less, or about 0.01 or less. In some embodiments, the magnitude of the difference between the average refractive index of the microlenses of the microlens array and the refractive index of the substrate is between about 0.00 and about 0.30, between about 0.00 and about 0.25, between about 0.00 and about 0.20, between about 0.00 and about 0.15, between about 0.00 and about 0.10, between about 0.00 and about 0.05, or between about 0.00 and about 0.01.

In some embodiments, at least a portion of the microlenses comprise a polymer. A non-limiting example of a suitable polymer is polydimethylsiloxane. In some embodiments, at least a portion of the microlenses comprise silica (e.g., fused silica). In certain cases, each microlens of the microlens array is formed from the same material. In some cases, at least a first portion of the microlenses are formed from a first material, and a second portion of the microlenses are formed from a second, different material.

The microlenses of the microlens array may have any suitable shape and size. In some embodiments, at least a portion of the microlenses have a hemispherical shape. In certain cases, each of the microlenses of the microlens array has a hemispherical shape. However, other microlens shapes, such as spherical microlenses and/or microlenses having a convex contour, may also be used.

In certain embodiments, at least a portion of the microlenses have a diameter of about 100 μm or less, about 50 μm or less, about 20 μm or less, about 10 μm or less, about 1 μm or less, about 0.5 μm or less, about 0.2 μm or less, or about 0.1 μm or less. In some embodiments, at least a portion of the microlenses have a diameter in a range between about 0.1 μm and about 0.5 μm, between about 0.1 μm and about 1 μm, between about 0.1 μm and about 10 μm, between about 0.1 μm and about 20 μm, between about 0.1 μm and about 50 μm, or between about 0.1 μm and about 100 μm. In some embodiments, at least a portion of the microlenses of the microlens array have the same size (e.g., the same diameter). In some embodiments, each microlens of the microlens array has the same size (e.g., the same diameter). In certain embodiments, at least a portion of the microlenses of the microlens array have different sizes (e.g., different diameters).

In some cases, one or more microlenses of the microlens array are arranged in a pattern. The pattern may be regular, irregular, periodic, quasiperiodic, or random. In some embodiments, at least a portion of the microlenses may be arranged in a hexagonal close-packed structure. In certain cases, spacing between microlenses of the microlens array may be about 10 μm or less, about 5 μm or less, about 2 μm or less, or about 1 μm or less. In certain embodiments, there is no spacing between microlenses of the microlens array (e.g., the microlenses are in direct physical contact).

In some embodiments, the microlens array comprises at least about 4 microlenses, at least about 25 microlenses, at least about 49 microlenses, or at least about 100 microlenses. In certain embodiments, the microlens array comprises between about 4 microlenses and 25 microlenses, between about 4 microlenses and 49 microlenses, between about 4 microlenses and 100 microlenses, between about 25 microlenses and 49 microlenses, between about 25 microlenses and 100 microlenses, or between about 49 microlenses and 100 microlenses.

The microlens array may be fabricated using inkjet printing, molding, or any other suitable method. In certain embodiments, at least one microlens may be formed by depositing a drop of a polymer dissolved in a solvent on a substrate and subsequently removing the solvent. In some embodiments, at least one microlens may be formed by depositing a drop of a monomer and polymerizing the monomer (e.g., via heat or ultraviolet radiation).

According to some embodiments, the OLED comprises a macro lens. In some cases, the macro lens may advantageously promote extraction of light from the substrate mode. In some embodiments, the macro lens is positioned adjacent an external surface of the substrate. In certain embodiments, the macro lens is in direct physical contact with an external surface of the substrate.

In some embodiments, the macro lens has a relatively high refractive index. In some embodiments, the macro lens has a refractive index of at least about 1.4, at least about 1.5, at least about 1.6, at least about 1.7, or at least about 1.8. In some cases, the macro lens has a refractive index of about 1.80 or less, about 1.70 or less, about 1.60 or less, about 1.50 or less, or about 1.40 or less. The macro lens may, in some embodiments, have a refractive index in a range between about 1.40 and about 1.50, between about 1.40 and about 1.60, between about 1.40 and about 1.70, between about 1.40 and about 1.80, between about 1.50 and about 1.60, between about 1.50 and about 1.70, between about 1.50 and about 1.80, between about 1.60 and about 1.70, between about 1.60 and about 1.80, or between about 1.70 and about 1.80.

In some embodiments, the macro lens has a refractive index that is substantially similar to the refractive index of the substrate. In certain embodiments, the magnitude of the difference between the refractive index of the macro lens and the refractive index of the substrate is about 0.30 or less, about 0.25 or less, about 0.20 or less, about 0.15 or less, about 0.10 or less, about 0.05 or less, about 0.02 or less, or about 0.01 or less. In some embodiments, the magnitude of the difference between the refractive index of the macro lens and the refractive index of the substrate is between about 0.00 and about 0.30, between about 0.00 and about 0.25, between about 0.00 and about 0.20, between about 0.00 and about 0.15, between about 0.00 and about 0.10, between about 0.00 and about 0.05, between about 0.00 and about 0.02, or between about 0.00 and about 0.01. In some embodiments, the macro lens comprises silica (e.g., fused silica). In some embodiments, the macro lens comprises a polymer (e.g., polydimethylsiloxane).

The macro lens may have any suitable size and shape. In some embodiments, the macro lens has a hemispherical shape. In some cases, the macro lens is sufficiently large to cover the emitting area of an OLED. Accordingly, in certain embodiments, the macro lens has a diameter larger than the largest dimension (e.g., length, diameter) of the emitting area of an OLED. In some embodiments, the macro lens has a diameter of at least about 1 mm, at least about 2 mm, at least about 3 mm, at least about 4 mm, at least about 5 mm, or at least about 10 mm. In some embodiments, the macro lens has a diameter in a range between about 1 mm and about 2 mm, between about 1 mm and about 3 mm, between about 1 mm and about 4 mm, between about 1 mm and about 5 mm, between about 1 mm and about 10 mm, between about 2 mm and about 5 mm, between about 2 mm and about 10 mm, or between about 5 mm and about 10 mm.

In some embodiments, the OLED further comprises a light extraction film. In some embodiments, the light extraction film is positioned adjacent the substrate. In some embodiments, the light extraction film is in direct physical contact with the substrate. In certain embodiments, the light extraction film may comprise a plurality of nanostructures and/or microstructures. In some embodiments, the light extraction film comprises nanoparticles. In certain cases, the nanostructures, microstructures, and/or nanoparticles may promote light scattering and thereby promote extraction of light from the substrate mode.

In some embodiments, the OLED has a relatively large emitting area. In some embodiments, the OLED has an emitting area of at least about $1\times1$ mm$^2$, at least about $2\times2$ mm$^2$, at least about $5\times5$ mm$^2$, or at least about $10\times10$ mm$^2$. In certain embodiments, the OLED has an emitting area between about $1\times1$ mm$^2$ and about $5\times5$ mm$^2$, about $1\times1$ mm$^2$ and about $10\times10$ mm$^2$, about $2\times2$ mm$^2$ and about $5\times5$ mm$^2$, about $2\times2$ mm$^2$ and about $10\times10$ mm$^2$, or about $5\times5$ mm$^2$ and about $10\times10$ mm$^2$.

In some embodiments, the OLEDs described herein exhibit improved performance relative to conventional OLEDs. For example, the OLEDs described herein may exhibit high external quantum efficiency (EQE). EQE generally refers to the ratio of photons emitted from an OLED to electrons entering the OLED. EQE may be measured according to any method known in the art. For example, an OLED may be driven by a source meter (e.g., a Keithley 2400 source meter) such that it generates light, and electroluminescence (EL) spectra may be recorded using a spectrometer (e.g., an Ocean Optics HR4000 spectrometer) at 0.1 mA/cm$^2$ at a peak wavelength of the generated light.

In some embodiments, the OLED has an EQE of at least about 40%, at least about 50%, at least about 60%, at least about 65%, at least about 67%, at least about 70%, at least about 75%, at least about 80%, at least about 85%, or at least about 90%. In some embodiments, the OLED has an EQE between about 40% to about 60%, about 40% to about 65%, about 40% to about 70%, about 40% to about 75%, about 40% to about 80%, about 40% to about 85%, about 40% to about 90%, about 50% to about 65%, about 50% to about 70%, about 50% to about 75%, about 50% to about 80%, about 50% to about 85%, about 50% to about 90%, about 60% to about 75%, about 60% to about 80%, about 60% to about 85%, about 60% to about 90%, about 70% to about 90%, or about 80% to about 90%.

In some embodiments, the OLEDs described herein have relatively high current efficiency. Current efficiency generally refers to luminance at a wavelength (e.g., a peak wavelength of light generated by a light-emitting layer of the OLED) divided by current density. Current efficiency may be measured according to any method known in the art. For example, current efficiency may be measured using the source meter and spectrometer described above. In some cases, an OLED may be driven by a source meter such that it generates light, and an EL spectrum may be recorded using a spectrometer at 0.1 mA/cm$^2$ at a peak wavelength of the generated light. To obtain current efficiency, a measured value of luminance may be divided by the current density entering the OLED through the source meter.

In some embodiments, the OLEDs described herein have a current efficiency of at least about 10 cd/A, at least about 25 cd/A, at least about 50 cd/A, at least about 75 cd/A, at least about 100 cd/A, at least about 125 cd/A, at least about 150 cd/A, at least about 175 cd/A, at least about 200 cd/A, at least about 225 cd/A, or at least about 250 cd/A. In some embodiments, the OLED has a current efficiency between about 10 cd/A and about 25 cd/A, about 10 cd/A and about 50 cd/A, about 10 cd/A and about 100 cd/A, about 10 cd/A and about 125 cd/A, about 10 cd/A and about 150 cd/A, about 10 cd/A and about 175 cd/A, about 10 cd/A and about 200 cd/A, about 10 cd/A and about 225 cd/A, about 10 cd/A and about 250 cd/A, about 25 cd/A and about 50 cd/A, about 25 cd/A and about 75 cd/A, about 25 cd/A and about 100 cd/A, about 25 cd/A and about 125 cd/A, about 25 cd/A and about 150 cd/A, about 25 cd/A and about 175 cd/A, about 25 cd/A and about 200 cd/A, about 25 cd/A and about 225 cd/A, about 25 cd/A and about 250 cd/A, about 50 cd/A and about 100 cd/A, about 50 cd/A and about 125 cd/A, about 50 cd/A and about 150 cd/A, about 50 cd/A and about 175 cd/A, about 50 cd/A and about 200 cd/A, about 50 cd/A and about 225 cd/A, about 50 cd/A and about 250 cd/A, about 100 cd/A and about 125 cd/A, about 100 cd/A and about 150 cd/A, about 100 cd/A and about 175 cd/A, about 100 cd/A and about 200 cd/A, about 100 cd/A and about 225 cd/A, about 100 cd/A and about 250 cd/A, about 150 cd/A and about 200 cd/A, about 150 cd/A and about 225 cd/A, about 150 cd/A and about 250 cd/A, or about 200 cd/A and about 250 cd/A.

Embodiments described herein may be used in a variety of devices and applications. For example, certain embodiments may be used to create a display in devices including, but not limited to, televisions, telephones (e.g., mobile telephones), computers, tablets, smart watches, health monitors, game consoles (e.g., handheld game consoles), and billboards. In some cases, embodiments described herein may be particularly suitable for use in portable products (e.g., mobile telephones, smart watches, laptop computers, health monitors, handheld game consoles). In some embodiments, the display may be a flexible display. Some embodiments described herein may be used as a lighting source (e.g., to illuminate a room).

Some aspects relate to methods of fabricating an OLED. In some embodiments, the method comprises the step of providing a substrate. The substrate may be substantially planar or may comprise a grating structure. In certain embodiments, a grating structure may be formed by depositing an array of spheres (e.g., silica spheres) on a planar substrate. The array of spheres may then be used as a sacrificing mask for an etching step (e.g., inductively-coupled plasma reactive ion etching) to obtain a grating structure with a periodicity corresponding to the diameters of the spheres.

In some embodiments, a substrate comprising a grating structure refers to a planar substrate and a resin layer comprising a grating structure, where the substrate and the resin layer are in direct physical contact, and where the difference between the refractive index of the substrate and the refractive index of the resin layer is relatively small (e.g., about 0.1 or less). In some embodiments, the substrate comprising a grating structure may be formed by depositing a resin layer on a planar substrate, applying a stamp (e.g., a corrugated stamp) to the resin layer, curing the resin to form a grating structure on the resin layer, and removing the stamp. In some embodiments, the stamp comprises a polymer. A non-limiting example of a suitable polymer is polydimethylsiloxane. In certain embodiments, the stamp may be formed using a template (e.g., a corrugated sapphire structure).

In some embodiments, a light extraction layer may be deposited on the substrate (e.g., a substrate comprising a grating structure). In certain embodiments, the light extraction layer may be thermally deposited on the substrate. In some embodiments, the first electrode may be deposited on the light extraction layer. In certain embodiments, the first electrode may be sputtered on the light extraction layer. In some embodiments, one or more organic layers may be deposited on the first electrode. In certain embodiments, the one or more organic layers may be thermally deposited on the first electrode. In certain embodiments, the one or more organic layers may be deposited by a solution process (e.g., spin-coated). In some embodiments, a second electrode may be deposited on the one or more organic layers. In certain embodiments, the second electrode may be sputtered on the one or more organic layers. In certain cases, following deposition (e.g., thermal deposition, sputtering) of all the layers of the OLED, the OLED may be encapsulated (e.g., with glass and a sealant, such as a UV-curable sealant). In some embodiments, the OLED may be encapsulated in a nitrogen-ambient glove box.

EXAMPLE

This Example describes the design and fabrication of grating OLEDs (e.g., corrugated OLEDs) comprising a light extraction layer, where the light extraction layer increases refractive index contrast between a substrate and an electrode.

In organic light-emitting diodes (OLEDs), the low outcoupling efficiency of 20-30% limits the external quantum efficiency (EQE). Corrugated grating structures for OLED light extraction can increase the outcoupling efficiency by extracting the waveguided mode as well as the surface plasmon (SP) mode. To further enhance the outcoupling efficiency of a grating OLED (e.g., corrugated OLED), the refractive index contrast was increased by incorporating a low-refractive-index light outcoupling layer (e.g., a light extraction layer) in the device. The resulting OLED had an external quantum efficiency of 67%. By fabricating these grating OLEDs with the emitting layer located at the first or second antinode position, it was confirmed that the enhanced efficiency came from enhanced extraction of the waveguided modes.

Significant efforts have been devoted to increasing the light outcoupling efficiency of OLEDs. To extract the substrate mode, techniques such as sand-blasting the substrates or attaching a microlens array or a light extraction film to the opposite side of the substrates have been demonstrated. To recover the waveguided mode in the indium tin oxide (ITO) and organic layers in OLEDs, corrugated structures, photonic crystals, low-index grids, anisotropic dipole orientation, and double-sided transparent electrodes have been introduced. In particular, corrugated grating structures have been exploited to recover the light lost due to the waveguided mode. In grating OLEDs, a periodically corrugated metal layer can outcouple the SP mode associated with an organic/metal interface by modifying the in-plane wave vector component of the SP mode via Bragg diffraction. Because of the broad distribution of periodicity, the enhancement in light extraction efficiency is independent of both emission spectrum and angle. However, it is commonly accepted that most of the enhancement from the corrugated grating structure is attributed to the SP mode extraction, while the extraction of the waveguided modes in grating OLEDs is not efficient due to the small refractive index difference between the glass substrate (n about 1.52) and the ITO layer (n about 1.8).

In this Example, the light extraction efficiency of the ITO/organic mode (e.g., waveguided mode) and the SP mode using quasi-periodic grating OLEDs in the first and second antinode conditions was evaluated. Furthermore, a scheme was suggested to improve the light extraction of corrugated grating structures by inserting a low-refractive-index LiF layer between the glass substrate and the ITO layer. The enhanced contrast in refractive index between the LiF and the ITO layers caused higher diffraction efficiency of the ITO/organic mode (e.g., waveguided mode), resulting in a 61% enhancement in efficiency compared to planar OLEDs. With an additional macro lens, a green phosphorescent grating OLED with an extremely high efficiency (210 cd $A^{-1}$ and 67% EQE) was demonstrated.

A corrugated grating structure with a nominal periodicity of 500 nm was fabricated on a sapphire substrate. By depositing 0.5-µm-diameter silica spheres on the sapphire substrate, a monolayer array of silica spheres was formed. Using the array as a sacrificing mask for inductively-coupled plasma reactive ion etching (ICP-RIE), a corrugated grating structure with periodicity corresponding to the diameters of the silica particles was obtained. Since the diffraction efficiency was highly sensitive to corrugation depth, the etching time was controlled to give an optimum depth of 70-80 nm, which effectively outcoupled the waveguided mode and avoided electrical shortage due to the corrugated grating surface during device operation.

Figure 3A:
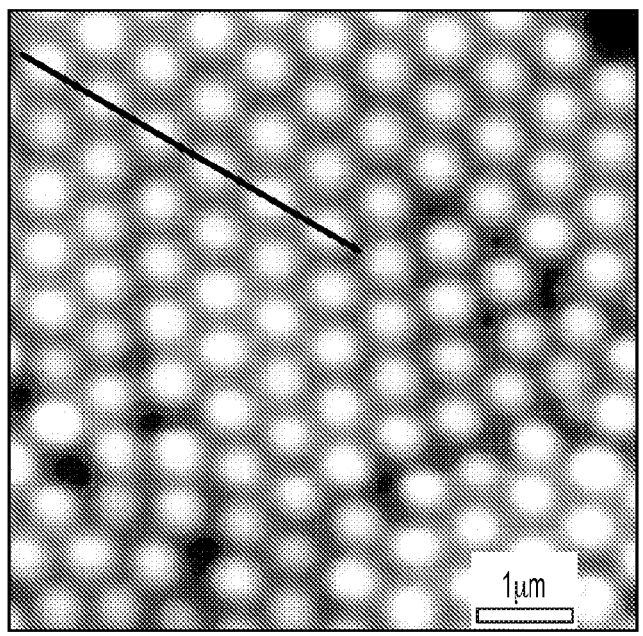
FIG. 3A is an atomic force microscopy (AFM) image of a top view of a corrugated resin structure fabricated on a glass substrate, according to some embodiments.
Figure 3B:
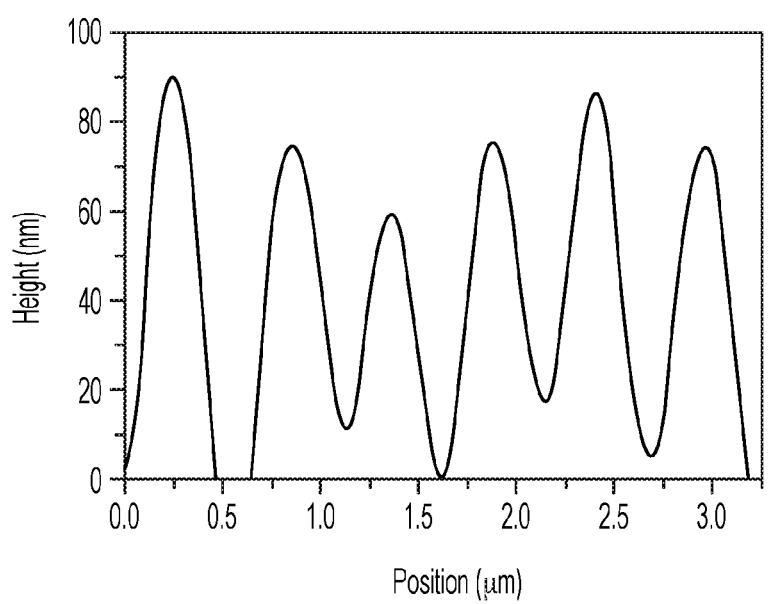
FIG. 3B is a depth profile of a corrugated resin structure fabricated on a glass substrate, according to some embodiments.

To fabricate the corrugated grating structure on a conventional glass substrate, a polydimethylsiloxane (PDMS) stamp was first prepared using the corrugated sapphire substrate as a template. After a drop of UV-curable resin was placed on the planar glass substrate, the stamp was applied on top of the substrate. The PDMS stamp was then UV treated and removed, leaving a corrugated resin structure (n=1.52) on a 0.1-mm-thick glass layer. OLED devices were fabricated on both the corrugated substrates and planar resin-coated substrates. FIG. 3A shows an atomic force microscopy (AFM) image of the corrugated substrate, and FIG. 3B shows a corresponding depth profile of the corrugated substrate. Although the corrugated grating structure exhibited a hexagonal close packed (HCP) array with short range ordering, the lack of long range ordering resulted in broadened periodicity distribution and random orientation. The depth profile in the AFM image of FIG. 3B showed a nominal periodicity of 0.5 µm, which was the same as the diameter of silica particles used for fabrication. The depth of the corrugated resin structure on the glass substrate was 70-80 nm, which was the same as that of the corrugated sapphire template.

To enhance the refractive index contrast, a 90-nm-thick layer of lithium fluoride (LiF) was deposited on the corrugated substrate prior to the deposition of the ITO anode. Because of the low refractive index of LiF (n=1.39), it was hypothesized that the higher contrast between the LiF and ITO (Δn about 0.41) from the grating OLED would enhance the extraction of the waveguided mode, compared to the smaller index contrast between the glass and ITO layer (Δn about 0.28) in conventional grating OLEDs.

Figure 4:
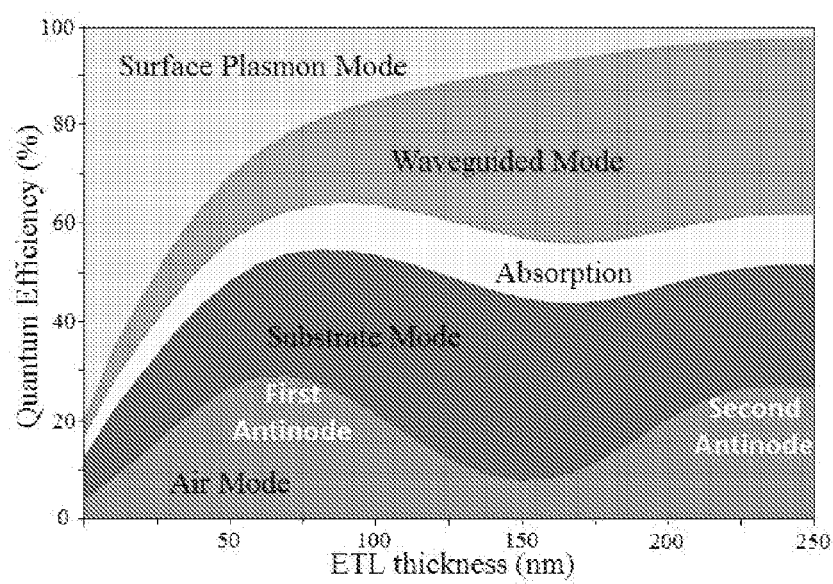
FIG. 4 shows, according to some embodiments, a mode analysis of a planar green OLED.

To confirm the diffraction efficiency of the corrugated grating structure with and without the additional layer of LiF, green OLEDs (peak emission wavelength of 515 nm) with different emitter locations in OLEDs were designed in Setfos (FIG. 4). The mode analysis indicated that the optimum outcoupling condition could be met by tuning the thickness of the electron transporting layer (ETL) and placing the emitter molecules at the first or second antinode position. Although the outcoupling efficiency (ratio of light in air mode) was similar for these two conditions, the loss mechanisms were very different. For the first antinode condition (about 60-nm-thick ETL), the fraction of power lost to waveguided mode (15%) was about equal in magnitude to the fraction lost to SP mode (21%). For the second antinode condition (about 240-nm-thick ETL), the fraction of power lost to waveguided mode increased to 37%, while that lost to the SP mode decreased to 5%. Therefore, by incorporating the corrugated grating structure with these two different OLED configurations, the diffraction efficiency on the waveguided mode and SP mode in these grating OLEDs could be directly determined.

Figure 8A:
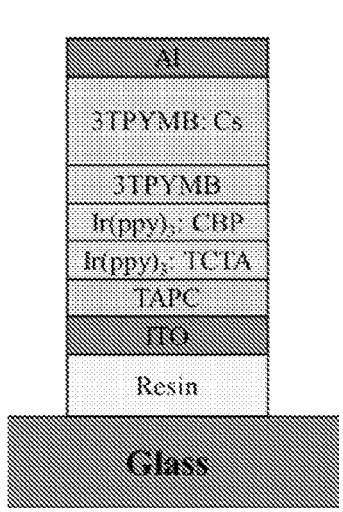
FIG. 8A shows a schematic illustration of a planar OLED that does not comprise an LiF layer ("reference OLED"), according to some embodiments.
Figure 8B:
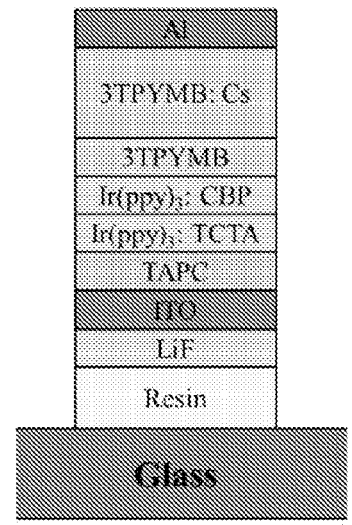
FIG. 8B shows a schematic illustration of a planar OLED comprising an LiF layer ("LiF-planar OLED"), according to some embodiments.
Figure 8C:
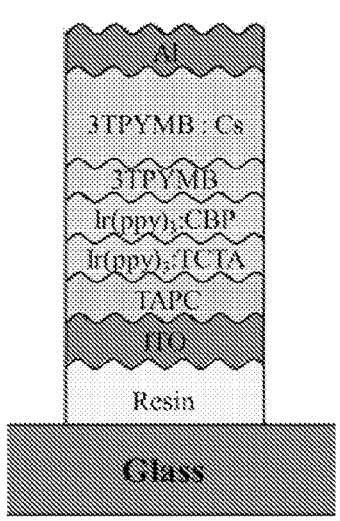
FIG. 8C shows a schematic illustration of a grating OLED that does not comprise an LiF layer ("grating OLED"), according to some embodiments.
Figure 8D:
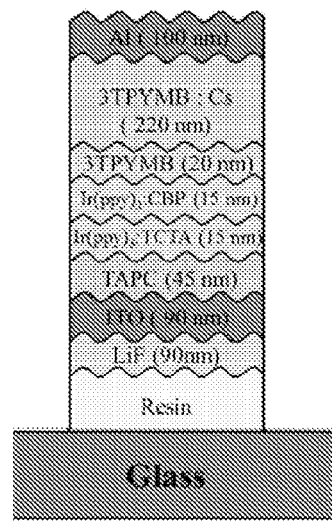
FIG. 8D shows a schematic illustration of a grating OLED comprising an LiF layer ("LiF-grating OLED"), according to some embodiments.

For OLED fabrication, the following layers were deposited for both the first antinode and second antinode OLEDs: a 45-nm-thick TAPC (4,4'-Cyclohexylidenebis(N,N-bis(4-methylphenyl)benzenamine)) layer as the hole transport layer (HTL), and a 15-nm-thick CBP (4,4'-Bis(N-carbazolyl)-1,1'-biphenyl) doped with 12 wt % Ir(ppy)$_3$, and a 15-nm-thick TCTA (Tris(4-carbazoyl-9-ylphenyl)amine) doped with 12 wt % Ir(ppy)$_3$ as the double emissive layer (EML). For the first antinode OLEDs, a 55-nm-thick 3TPYMB (Tris(2,4,6-trimethyl-3-(pyridin-3-yl)phenyl)borane) layer was used as the electron transport layer (ETL), as shown in FIG. 5D. For the second antinode OLEDs, a 20-nm-thick 3TPYMB layer and a 220-nm-thick Cs-doped 3TPYMB layer were used as the ETL, as shown in FIG. 8D. The doping was to cope with charge balance issues during operation at high current densities. For the cathode electrode, 1-nm LiF and 100-nm aluminum (Al) were deposited for both the first antinode and second antinode OLEDs.

The current-luminance-voltage characteristics for the four OLEDs fabricated in the first antinode condition are shown in FIG. 6A. At a fixed voltage, the grating OLEDs (e.g., corrugated OLEDs) showed higher current densities compared to the planar OLEDs. This may be attributed to the stronger electric field induced by the locally thin organic layer in the grating OLEDs. The currents of the grating OLEDs before the turn-on voltage were close to those of the two planar OLEDs, indicating that the 70-80 nm depth of the corrugated grating structure did not cause leakage current in the grating OLEDs. Both grating OLEDs showed higher luminance compared with the corresponding planar OLEDs because of the outcoupling of trapped light in the organic/ITO layers via Bragg diffraction. The electroluminescence (EL) spectra of the four OLEDs are shown in FIG. 6B. Due to Bragg diffraction, the grating wave vectors modified the in-plane wave vector component of the waveguided mode, leading to enhanced outcoupling into the air mode. The grating wave vector was inversely proportional to the periodicity of the corrugated grating structure. Thus, the wave vectors induced by the quasi-periodic corrugated grating structure were eventually applied on a broad range of wavelengths in waveguided mode. As a result, the spectrum shift from the original emission profile was not severe, as shown in FIG. 6B. The current efficiencies for the four OLEDs are shown in FIG. 6C. It can be seen that both grating OLEDs had higher efficiencies compared to the planar OLEDs.

Table 1 shows the peak current efficiency for the four OLEDs. The LiF-planar OLED did not show any difference in efficiency compared to that of the planar reference OLED. Furthermore, the electrical and optical characteristics of the LiF-planar and planar reference OLEDs (FIG. 6A) were almost identical, indicating that adding the LiF layer did not affect the device performance in the planar OLED structures. However, the LiF-grating OLED showed a higher efficiency (144 cd $A^{-1}$) compared to the grating OLED that did not have an LiF layer (127 cd $A^{-1}$). As shown in Table 1, compared to the planar reference OLED, the grating OLED showed 43% enhancement in efficiency (i.e., efficiency of the grating OLED divided by efficiency of the planar reference OLED), and the LiF-grating OLED showed 61% enhancement in efficiency (i.e., efficiency of the LiF-grating OLED divided by the efficiency of the LiF-planar OLED). Given the fact that both the grating and LiF-grating OLEDs had the same corrugation, the extra 18% enhancement in the LiF-grating OLED suggests that the enhanced refractive index contrast improved the diffraction efficiency of the waveguided mode.

TABLE 1

| OLEDs | Planar reference | LiF-planar | Grating | LiF-grating |
|---|---|---|---|---|
| Peak current efficiency (cd A$^{-1}$) | 89 | 89 | 127 | 144 |
| Enhancement (%) | N/A | N/A | 43 | 61 |

Figure 7:
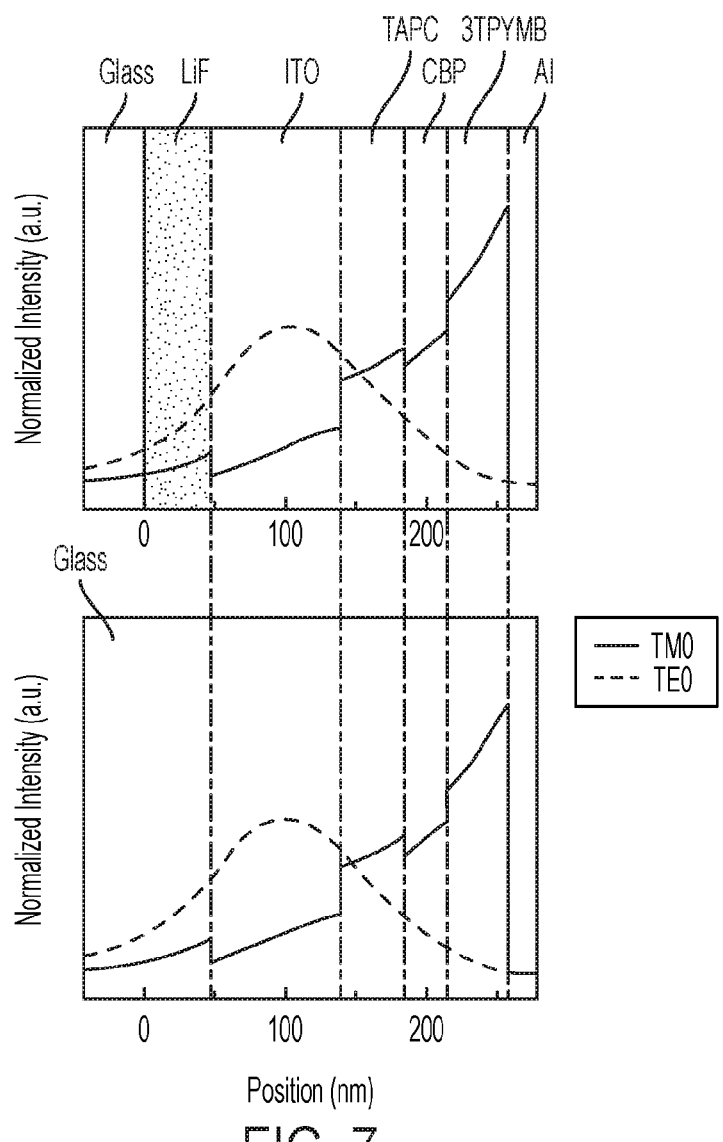
FIG. 7 shows electric field intensities of one SP (TM0) and one ITO/organic (TE0) mode as a function of the position inside a planar OLED with (top) and without (bottom) a 90-nm-thick LiF layer, as calculated by the transfer matrix method.

To determine the possible optical environment variations due to the introduced low-index layer, the electric field intensities for transverse electric (TE) and transverse magnetic (TM) waveguided modes were calculated for planar OLED devices with and without the LiF interlayer by the transfer matrix method, and the results are shown in FIG. 7. For both OLEDs with and without the LiF layer, the SP (TM0) mode associated with organic/cathode interface showed significantly high electrical field intensity at that interface, while the maximum intensity of the waveguided (TE0) mode was broadly distributed near the ITO layer with relatively small magnitude. Since the diffraction efficiency was proportional to the intensity of the electric field, strong outcoupling of the SP mode via diffraction grating was expected. The presence of the LiF interlayer did not affect the SP mode in either mode. Because of the higher contrast in refractive index between LiF and ITO ($\Delta n=0.41$) compared to glass and ITO ($\Delta n=0.28$), it was expected that the waveguided mode (TE0) would be slightly more confined to the ITO/organic layer. However, no significant effect was observed due to the small variation in refractive index. Thus, the outcoupling efficiency from both planar OLEDs with and without LiF interlayer were similar, as shown in FIG. 6A.

Figure 9A:
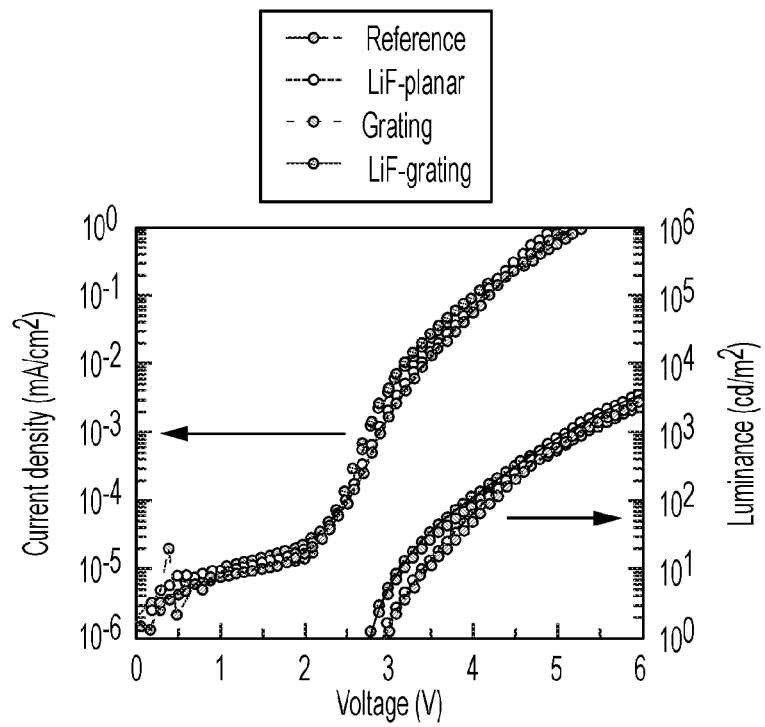
FIG. 9A shows, according to some embodiments, a plot of current density (mA/cm$^2$) and luminance (cd/m$^2$) as a function of voltage (V) for the reference OLED, LiF-planar OLED, grating OLED, and LiF-grating OLED illustrated in FIGS. 8A-D.
Figure 9B:
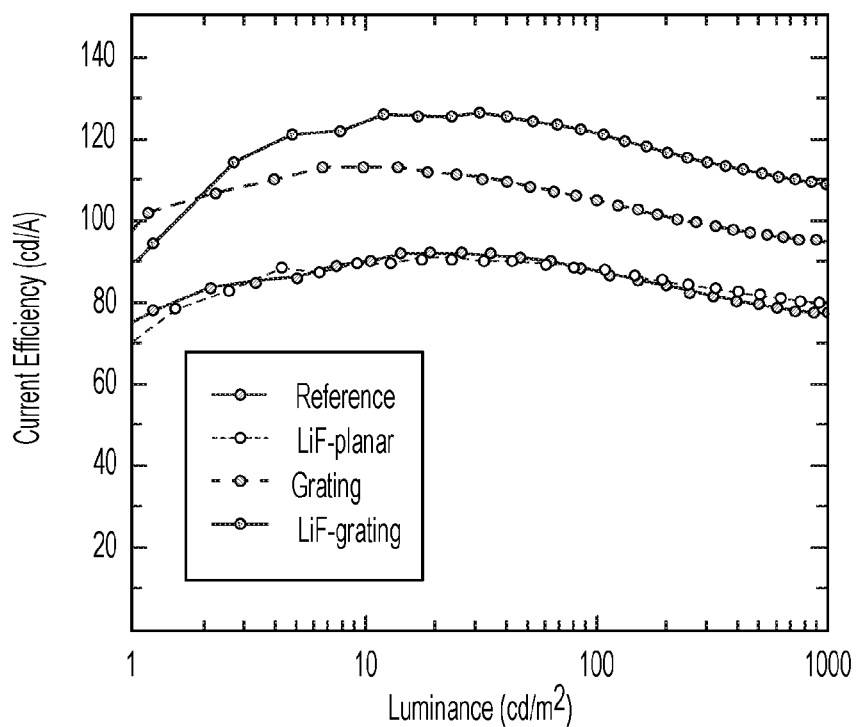
FIG. 9B shows, according to some embodiments, a plot of current efficiency (cd/A) as a function of luminance (cd/m$^2$) for the reference OLED, LiF-planar OLED, grating OLED, and LiF-grating OLED illustrated in FIGS. 8A-D.

As described earlier, the power loss due to SP mode excitation became almost negligible when the emitter was located at the second antinode position, and the waveguided mode confined by total internal reflection within the ITO/glass layer became the dominant loss channel. By outcoupling only the waveguided mode with the corrugated grating structure, the effect of the grating index contrast on extraction efficiency of the waveguided mode was determined. FIG. 9A shows the performance of the second antinode OLEDs with and without the LiF interlayer. The grating OLED showed an efficiency of 113 cd A$^{-1}$, while the LiF-grating OLED showed a maximum efficiency of 126 cd A$^{-1}$ (FIG. 9B). Since all grating OLEDs had the same corrugation grating structure, as confirmed by AFM results, it was concluded that the difference in efficiency was due to the extraction of waveguided mode. Compared to the current efficiency of the reference planar OLED (90 cd A$^{-1}$), the enhancement ratios for the grating and LiF-grating OLEDs were 25% and 40%, respectively. This extra 15% enhancement for the second antinode LiF-grating OLED was due to the enhanced diffraction efficiency of the waveguided mode as a result of the higher index contrast between LiF and ITO.

It should be emphasized that the first antinode grating OLED showed higher current efficiency (127 cd A$^{-1}$) compared to the second antinode OLED (113 cd A$^{-1}$). The difference in efficiency may be attributed to two factors. First, the first antinode OLED had a larger portion of SP mode, which could be extracted with the corrugated grating structure. Second, although there was more waveguided mode in the second antinode OLED, its distribution close to the low-index layer was limited due to the thicker organic layers used, and the actual extractable waveguided mode was similar to the first antinode condition. Therefore, the overall efficiency of the second antinode OLED was lower than the first antinode OLED.

Figure 10A:
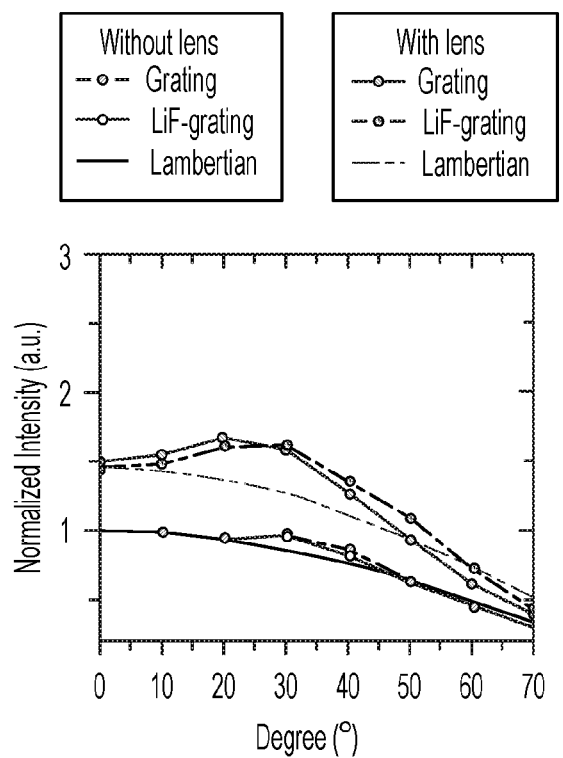
FIG. 10A shows an angular intensity measurement for grating OLEDs with and without a substrate-mode-extracting macro lens, according to some embodiments.
Figure 10B:
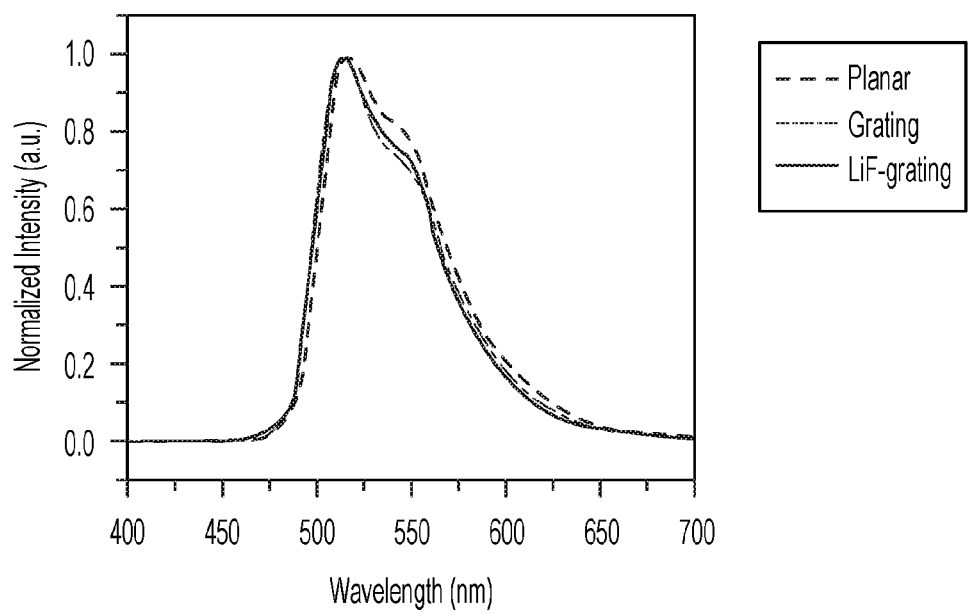
FIG. 10B shows electroluminescence (EL) spectra for a reference OLED, a grating OLED, and an LiF-grating OLED measured at normal direction with a substrate-mode-extracting macro lens applied on a back side of the substrate, according to some embodiments.

To evaluate the total light outcoupling efficiency, a hemispherical lens was used on the back side of the substrate to extract the substrate mode. To make a good optical contact between the lens and substrate, an optical matching gel with refractive index of 1.5 was used. FIG. 10A shows the angular intensity for the LiF-grating and grating OLEDs with and without the lens. FIG. 10A clearly shows that with the lens, about 50% additional enhancement was achieved from both grating OLEDs. Compared to the Lambertian distribution, which is a measure of uniform light output as a function of polar angle, both grating OLEDs showed a stronger enhancement with the macro lens at angles of 20-30°. This angular emission profile corresponded to the first-order diffraction angle for the waveguided mode around the emission peak at 515 nm with a 0.5 µm peak periodicity. OLEDs fabricated on conventional photonic crystals or gratings having well-ordered symmetry generally show emission profiles with a distinctive butterfly pattern. Here, OLEDs fabricated on corrugated grating structures with random orientation and broad distribution of periodicity showed a weak butterfly pattern, indicating the grating effects. FIG. 10B shows that the EL spectra of both grating OLEDs were similar to those of the planar reference OLEDs, indicating that the enhancement was not limited to certain emission wavelengths.

To determine the outcoupling efficiency for the grating OLEDs with a macro lens substrate mode extractor, the Lambertian correction factor was also considered, because the angular patterns of both grating OLEDs slightly deviated from the Lambertian pattern. The results of the total outcoupling efficiency are shown in Table 2. A maximum current efficiency of 210 cd A$^{-1}$ and an EQE of 67% were achieved for the first antinode LiF-grating OLED with the substrate mode extractor, which was the highest efficiency reported among the conventional bottom-emitting OLEDs fabricated on a conventional glass substrate. As shown in the table, the performance of first antinode grating OLEDs was better than that of the second antinode ones, indicating that the outcoupling of SP mode by corrugated grating structure is more effective than waveguided mode.

TABLE 2

| OLEDs | Additional substrate mode enhancement | Peak current efficiency (cd A$^{-1}$) | Peak EQE (%) |
|---|---|---|---|
| 1st antinode grating | ×1.48 | 187 | 53 |
| 1st antinode LiF-grating | ×1.45 | 210 | 67 |
| 2nd antinode grating | ×1.50 | 170 | 48 |
| 2nd antinode LiF-grating | ×1.49 | 188 | 53 |

In conclusion, it was demonstrated that by controlling the index contrast for the corrugated grating structure, the OLED light outcoupling efficiency could be significantly enhanced due to the enhanced diffraction efficiency of the ITO/organic waveguided mode. Inserting a low-index LiF buffer layer between the glass substrate and the ITO layer resulted in a total of 61% enhancement in light outcoupling of the OLED. By extracting the substrate mode using a hemispherical lens, a green phosphorescent grating OLED with a high EQE of 67% was produced.

Experimental Section

For device fabrication, a 90-nm-thick layer of LiF was deposited on the grating and planar structures on the substrate using a thermal evaporator. ITO electrode and organic layers for an OLED device were fabricated by sputtering and using the same thermal evaporator. The emitting area of the OLEDs was 2×2 mm$^2$ for both grating and planar OLEDs. They were encapsulated with cover glass and UV-curable sealant in a nitrogen-ambient glove box before measurements.

For device characterization, a black box mounted with a calibrated photodiode was used to collect light emitted from the forward direction of the OLEDs driven by a source meter (Keithley 2400). Minolta LS200 was used for calibration as the luminance meter. EL spectra were recorded using a spectrometer (Ocean Optics HR4000) with the same source meter at 0.1 mA cm$^{-2}$ for all OLEDs. The emission profiles of the OLEDs were measured by mounting the OLEDs on a rotating stage with the spectrometer located at a fixed position. For substrate mode extraction, a 4-mm-diameter fused silica hemisphere macro lens and an index-matching gel with a refractive index of about 1.5 (Norland 81) were used.

For simulations, the software Setfos 3.4 was used for calculating the efficiency as a function of ETL thickness for Ir(ppy)$_3$ emission wavelength based on classical dipole theory and Fresnel equation by numerical computation.

While several embodiments of the present invention have been described and illustrated herein, those of ordinary skill in the art will readily envision a variety of other means and/or structures for performing the functions and/or obtaining the results and/or one or more of the advantages described herein, and each of such variations and/or modifications is deemed to be within the scope of the present invention.

More generally, those skilled in the art will readily appreciate that all parameters, dimensions, materials, and configurations described herein are meant to be exemplary and that the actual parameters, dimensions, materials, and/or configurations will depend upon the specific application or applications for which the teachings of the present invention is/are used. Those skilled in the art will recognize, or be able to ascertain using no more than routine experimentation, many equivalents to the specific embodiments of the invention described herein. It is, therefore, to be understood that the foregoing embodiments are presented by way of example only and that, within the scope of the appended claims and equivalents thereto, the invention may be practiced otherwise than as specifically described and claimed. The present invention is directed to each individual feature, system, article, material, kit, and/or method described herein. In addition, any combination of two or more such features, systems, articles, materials, kits, and/or methods, if such features, systems, articles, materials, kits, and/or methods are not mutually inconsistent, is included within the scope of the present invention.

All definitions, as defined and used herein, should be understood to control over dictionary definitions, definitions in documents incorporated by reference, and/or ordinary meanings of the defined terms.

The indefinite articles "a" and "an," as used herein in the specification and in the claims, unless clearly indicated to the contrary, should be understood to mean "at least one."

The phrase "and/or," as used herein in the specification and in the claims, should be understood to mean "either or both" of the elements so conjoined, i.e., elements that are conjunctively present in some cases and disjunctively present in other cases. Multiple elements listed with "and/or" should be construed in the same fashion, i.e., "one or more" of the elements so conjoined. Other elements may optionally be present other than the elements specifically identified by the "and/or" clause, whether related or unrelated to those elements specifically identified. Thus, as a non-limiting example, a reference to "A and/or B", when used in conjunction with open-ended language such as "comprising" can refer, in one embodiment, to A only (optionally including elements other than B); in another embodiment, to B only (optionally including elements other than A); in yet another embodiment, to both A and B (optionally including other elements); etc.

As used herein in the specification and in the claims, "or" should be understood to have the same meaning as "and/or" as defined above. For example, when separating items in a list, "or" or "and/or" shall be interpreted as being inclusive, i.e., the inclusion of at least one, but also including more than one, of a number or list of elements, and. optionally, additional unlisted items. Only terms clearly indicated to the contrary, such as "only one of" or "exactly one of," or, when used in the claims, "consisting of," will refer to the inclusion of exactly one element of a number or list of elements. In general, the term "or" as used herein shall only be interpreted as indicating exclusive alternatives (i.e. "one or the other but not both") when preceded by terms of exclusivity, such as "either," "one of," "only one of," or "exactly one of." "Consisting essentially of," when used in the claims, shall have its ordinary meaning as used in the field of patent law.

As used herein in the specification and in the claims, the phrase "at least one," in reference to a list of one or more elements, should be understood to mean at least one element selected from any one or more of the elements in the list of elements, but not necessarily including at least one of each and every element specifically listed within the list of elements and not excluding any combinations of elements in the list of elements. This definition also allows that elements may optionally be present other than the elements specifically identified within the list of elements to which the phrase "at least one" refers, whether related or unrelated to those elements specifically identified. Thus, as a non-limiting example, "at least one of A and B" (or, equivalently, "at least one of A or B," or, equivalently "at least one of A and/or B") can refer, in one embodiment, to at least one, optionally including more than one, A, with no B present (and optionally including elements other than B); in another embodiment, to at least one, optionally including more than one, B, with no A present (and optionally including elements other than A); in yet another embodiment, to at least one, optionally including more than one, A, and at least one, optionally including more than one, B (and optionally including other elements); etc.

It should also be understood that, unless clearly indicated to the contrary, in any methods claimed herein that include more than one step or act, the order of the steps or acts of the method is not necessarily limited to the order in which the steps or acts of the method arc recited.

In the claims, as well as in the specification above, all transitional phrases such as "comprising," "including," "carrying," "having," "containing," "involving," "holding," "composed of," and the like are to be understood to be open-ended, i.e., to mean including but not limited to. Only the transitional phrases "consisting of" and "consisting essentially of" shall be closed or semi-closed transitional phrases, respectively, as set forth in the United States Patent Office Manual of Patent Examining Procedures, Section 2111.03.

What is claimed is:

1. An organic light-emitting diode (OLED), comprising:
   a substrate disposed at a bottom of the OLED;
   a first electrode;
   a second electrode;
   one or more organic layers positioned between the first electrode and the second electrode, wherein the one or more organic layers comprise a light-emitting layer; and
   a light extraction layer positioned between the substrate and the first electrode, wherein a first interface between the light extraction layer and the first electrode comprises a first grating structure, wherein a refractive index of the light extraction layer is less than or equal to 1.45 and a refractive index of the first electrode is greater than or equal to 1.70, wherein the OLED is a bottom-emitting OLED, and wherein the substrate is at least partially transparent to light emitted from the light-emitting layer.

2. The OLED of claim 1, wherein a difference between the refractive index of the light extraction layer and the refractive index of the first electrode has a magnitude of at least 0.30.

3. The OLED of claim 1, wherein a difference between the refractive index of the light extraction layer and the refractive index of the first electrode has a magnitude between 0.20 and 1.00.

4. The OLED of claim 1, wherein the refractive index of the light extraction layer is 1.40 or less.

5. The OLED of claim 1, wherein the refractive index of the light extraction layer is between 1.00 and 1.45.

6. The OLED of claim 1, wherein a difference between the refractive index of the light extraction layer and a refractive index of the substrate has a magnitude of at least 0.05.

7. The OLED of claim 1, wherein a difference between the refractive index of the light extraction layer and a refractive index of the substrate has a magnitude between 0.05 and 1.00.

8. The OLED of claim 1, wherein the light extraction layer comprises an inorganic material.

9. The OLED of claim 1, wherein the light extraction layer comprises LiF, KF, and/or $AlF_3$.

10. The OLED of claim 1, wherein the light extraction layer comprises an aerogel.

11. The OLED of claim 1, wherein the first grating structure has an average periodicity between 200 nm and 2 µm.

12. The OLED of claim 1, wherein the first grating structure has an average amplitude between 30 nm and 150 nm.

13. The OLED of claim 1, wherein the first interface has an area, wherein the first grating structure covers at least 70% of the area of the first interface.

14. The OLED of claim 1, wherein a second interface between the light extraction layer and the substrate comprises a second grating structure.

15. The OLED of claim 14, wherein the second grating structure has an average periodicity between 200 nm and 2 µm.

16. The OLED of claim 14, wherein the second grating structure has an average amplitude between 30 nm and 150 nm.

17. The OLED of claim 14, wherein the second interface has an area, wherein the second grating structure covers at least 70% of the area of the second interface.

18. The OLED of claim 1, wherein the light extraction layer has a thickness between 50 nm and 150 nm.

19. The OLED of claim 1, wherein the light-emitting layer generates light having a peak wavelength between 400 nm and 700 nm.

20. The OLED of claim 1, wherein the light-emitting layer comprises $Alq_3$, $Ir(ppy)_3$, FIrpic, mCP, MEH-PPV, mCP:Ir(piq)$_3$, mCP:Ir(ppy)$_3$, mCP:FIrpic, Ir(ppy)$_3$:CBP and/or Ir(ppy)$_3$:TCTA.

21. The OLED of claim 1, wherein the substrate has a refractive index of at least 1.50.

22. The OLED of claim 1, wherein the substrate has a refractive index between 1.50 and 1.80.

23. The OLED of claim 1, wherein the substrate comprises glass and/or sapphire.

24. The OLED of claim 1, wherein the substrate is at least partially transparent to a peak wavelength of light generated by the light-emitting layer.

25. The OLED of claim 1, wherein an external surface of the substrate comprises a third grating structure.

26. The OLED of claim 1, wherein the third grating structure has an average periodicity between 200 nm and 2 µm.

27. The OLED of claim 1, wherein the third grating structure has an average amplitude between 30 nm and 150 nm.

28. The OLED of claim 1, wherein the external surface of the substrate has an area, wherein the third grating structure covers at least 70% of the area of the external surface of the substrate.

29. The OLED of claim 1, wherein at least a portion of the external surface of the substrate is substantially rough.

30. The OLED of claim 1, wherein at least a portion of the external surface of the substrate has a root mean square surface roughness of at least 100 nm.

31. The OLED of claim 1, wherein the first electrode is an anode and the second electrode is a cathode.

32. The OLED of claim 1, wherein the refractive index of the first electrode is at least 1.80.

33. The OLED of claim 1, wherein the refractive index of the first electrode is between 1.80 and 2.00.

34. The OLED of claim 1, wherein the first electrode is at least partially transparent to a peak wavelength of light generated by the light-emitting layer.

35. The OLED of claim 1, wherein the first electrode comprises indium tin oxide (ITO).

36. The OLED of claim 1, wherein a third interface between the first electrode and the one or more organic layers comprises a fourth grating structure.

37. The OLED of claim 36, wherein the fourth grating structure has an average periodicity between 200 nm and 2 µm.

38. The OLED of claim 36, wherein the fourth grating structure has an average amplitude between 30 nm and 150 nm.

39. The OLED of claim 36, wherein the third interface has an area, wherein the fourth grating structure covers at least 70% of the area of the third interface.

40. The OLED of claim 36, wherein a fourth interface between the one or more organic layers and the second electrode comprises a fifth grating structure.

41. The OLED of claim 40, wherein fifth grating structure has an average periodicity between 200 nm and 2 µm.

42. The OLED of claim 40, wherein the fifth grating structure has an average amplitude between 30 nm and 150 nm.

43. The OLED of claim 40, wherein the fourth interface has an area, wherein the fifth grating structure covers at least 70% of the area of the fourth interface.

44. The OLED of claim 1, wherein the one or more organic layers have an average refractive index between 1.5 and 1.8.

45. The OLED of claim 1, wherein each of the one or more organic layers has a refractive index between 1.5 and 1.8.

46. The OLED of claim 1, wherein the one or more organic layers further comprise a hole transport layer, a hole injection layer, an electron transport layer, and/or an electron injection layer.

47. The OLED of claim 1, further comprising a microlens array, a macro lens, or a light extraction film positioned adjacent an external surface of the substrate.

48. The OLED of claim 1, further comprising a resin layer positioned between the substrate and the light extraction layer.

49. The OLED of claim 48, wherein the resin layer has a refractive index, wherein a difference between the refractive index of the resin layer and a refractive index of the substrate has a magnitude less than 0.1.

50. The OLED of claim 1, wherein the OLED has a current efficiency of at least 100 cd/A.

51. The OLED of claim 1, wherein the OLED has a current efficiency of at least 200 cd/A.

52. The OLED of claim 1, wherein the OLED has a current efficiency in a range between 100 cd/A and 250 cd/A.

53. The OLED of claim 1, wherein the OLED has an external quantum efficiency (EQE) of at least 40%.

54. The OLED of claim 1, wherein the OLED has an external quantum efficiency (EQE) of at least 60%.

55. The OLED of claim 1, wherein the OLED has an external quantum efficiency (EQE) between 40% and 90%.

56. An organic light-emitting diode (OLED), comprising:
a substrate disposed at a bottom of the OLED;
a first electrode supported upon the substrate;
a second electrode;
a plurality of organic layers disposed between the first electrode and the second electrode, wherein plurality of organic layers comprise a light-emitting layer; and
a light extraction layer comprising one or more inorganic materials and positioned between the substrate and the first electrode, wherein a first interface of the light extraction layer and the first electrode comprises a first grating structure, wherein a second interface of the light extraction layer and the substrate comprises a second grating structure, wherein a refractive index of the light extraction layer is 1.45 or less and a refractive index of the first electrode is 1.70 or greater, wherein the OLED is a bottom-emitting OLED, and wherein the substrate is substantially transparent to light emitted from the light-emitting layer.

57. The OLED of claim 56, wherein a difference between the refractive index of the light extraction layer and the refractive index of the first electrode has a magnitude of at least 0.30.

58. The OLED of claim 56, wherein a difference between the refractive index of the light extraction layer and the refractive index of the first electrode has a magnitude between 0.20 and 1.00.

59. The OLED of claim 56, wherein the refractive index of the light extraction layer is 1.40 or less.

60. The OLED of claim 56, wherein the refractive index of the light extraction layer is between 1.00 and 1.45.

61. The OLED of claim 56, wherein a difference between the refractive index of the light extraction layer and a refractive index of the substrate has a magnitude of at least 0.05.

62. The OLED of claim 56, wherein a difference between the refractive index of the light extraction layer and a refractive index of the substrate has a magnitude between 0.05 and 1.00.

63. The OLED of claim 56, wherein the one or more inorganic materials comprise LiF, KF, and/or $AlF_3$.

64. The OLED of claim 56, wherein the light extraction layer comprises an aerogel.

65. The OLED of claim 56, wherein the first grating structure has an average periodicity between 200 nm and 2 µm.

66. The OLED of claim 56, wherein the first grating structure has an average amplitude between 30 nm and 150 nm.

67. The OLED of claim 56, wherein the first interface has an area, wherein the first grating structure covers at least 70% of the area of the first interface.

68. The OLED of claim 56, wherein the second grating structure has an average periodicity between 200 nm and 2 µm.

69. The OLED of claim 56, wherein the second grating structure has an average amplitude between 30 nm and 150 nm.

70. The OLED of claim 56, wherein the second interface has an area, wherein the second grating structure covers at least 70% of the area of the second interface.

71. The OLED of claim 56, wherein the light extraction layer has a thickness between 50 nm and 150 nm.

72. The OLED of claim 56, wherein the light-emitting layer generates light having a peak wavelength between 400 nm and 700 nm.

73. The OLED of claim 56, wherein the light-emitting layer comprises $Alq_3$, $Ir(ppy)_3$, FIrpic, mCP, MEH-PPV, $mCP:Ir(piq)_3$, $mCP:Ir(ppy)_3$, mCP:FIrpic, $Ir(ppy)_3$:CBP and/or $Ir(ppy)_3$:TCTA.

74. The OLED of claim 56, wherein the substrate has a refractive index of at least 1.50.

75. The OLED of claim 56, wherein the substrate has a refractive index between 1.50 and 1.80.

76. The OLED of claim 56, wherein the substrate comprises at least one of glass and sapphire.

77. The OLED of claim 56, wherein the substrate is at least partially transparent to a peak wavelength of light generated by the light-emitting layer.

78. The OLED of claim 56, wherein an external surface of the substrate comprises a third grating structure having an average periodicity between 200 nm and 2 µm and an average amplitude between 30 nm and 150 nm.

* * * * *